US012379755B2

(12) United States Patent
Rohrkemper et al.

(10) Patent No.: US 12,379,755 B2
(45) Date of Patent: Aug. 5, 2025

(54) DETECTION OF FEEDBACK CONTROL INSTABILITY IN COMPUTING DEVICE THERMAL CONTROL

(71) Applicant: ORACLE INTERNATIONAL CORPORATION, Redwood Shores, CA (US)

(72) Inventors: James Rohrkemper, Harbor Springs, MI (US); Sanjeev R. Sondur, Horsham, PA (US); Kenny C. Gross, Escondido, CA (US); Guang C. Wang, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 18/654,133

(22) Filed: May 3, 2024

(65) Prior Publication Data
US 2024/0281043 A1   Aug. 22, 2024

Related U.S. Application Data

(63) Continuation of application No. 17/516,975, filed on Nov. 2, 2021, now Pat. No. 12,001,254.

(51) Int. Cl.
*G06F 1/20* (2006.01)
*H05K 7/20* (2006.01)

(52) U.S. Cl.
CPC ......... *G06F 1/206* (2013.01); *H05K 7/20136* (2013.01); *H05K 7/20718* (2013.01); *H05K 7/20836* (2013.01)

(58) Field of Classification Search
None
See application file for complete search history.

(56) References Cited

U.S. PATENT DOCUMENTS 7,020,802 B2   3/2006   Gross et al.
7,281,112 B1   10/2007  Gross et al.
(Continued)

OTHER PUBLICATIONS

Garcia-Martin Eva et al., "Estimation of Energy Consumption in Machine Learning," Journal of Parallel and Distributed Computing, Elsevier, Amsterdan, NL, vol. 134, Aug. 21, 2019 (Aug. 21, 2019), pp. 77-88.

(Continued)

*Primary Examiner* — Ryan A Jarrett
(74) *Attorney, Agent, or Firm* — Kraguljac Law Group, LLC

(57) ABSTRACT

Systems, methods, and other embodiments associated with detecting feedback control instability in computer thermal controls are described herein. In one embodiment, a method includes executing a workload on the computing system, wherein the workload varies between a minimum and a maximum at a workload frequency. The method includes recording thermal telemetry from the computing system during execution of the workload. The method includes converting the recorded thermal telemetry into a frequency domain. The method includes detecting whether thermal control of the computing system exhibits feedback control instability based on dissimilarity in the frequency domain between the transformed thermal telemetry and the workload frequency. And, the method includes generating an electronic alert that indicates whether the thermal control of the computing device exhibits the feedback control instability.

20 Claims, 11 Drawing Sheets

(56) References Cited

U.S. PATENT DOCUMENTS

| | | | |
|---|---|---|---|
| 7,613,576 | B2 | 11/2009 | Gross et al. |
| 7,613,580 | B2 | 11/2009 | Gross et al. |
| 7,702,485 | B2 | 4/2010 | Gross et al. |
| 7,869,977 | B2 | 1/2011 | Lewis et al. |
| 8,055,594 | B2 | 11/2011 | Dhanekula et al. |
| 8,069,490 | B2 | 11/2011 | Gross et al. |
| 8,200,991 | B2 | 6/2012 | Vaidyanathan et al. |
| 8,275,738 | B2 | 9/2012 | Gross et al. |
| 8,341,759 | B2 | 12/2012 | Gross et al. |
| 8,457,913 | B2 | 6/2013 | Zwinger et al. |
| 8,543,346 | B2 | 9/2013 | Gross et al. |
| 8,862,905 | B2 * | 10/2014 | Vaidyanathan ..... G06F 11/3096 713/300 |
| 10,452,510 | B2 | 10/2019 | Gross et al. |
| 10,496,084 | B2 | 12/2019 | Li et al. |
| 2008/0252309 | A1 | 10/2008 | Gross et al. |
| 2008/0256398 | A1 | 10/2008 | Gross et al. |
| 2009/0099830 | A1 | 4/2009 | Gross et al. |
| 2009/0125467 | A1 | 5/2009 | Dhanekula et al. |
| 2009/0306920 | A1 | 12/2009 | Zwinger et al. |
| 2010/0023282 | A1 | 1/2010 | Lewis et al. |
| 2010/0033386 | A1 | 2/2010 | Lewis et al. |
| 2010/0305892 | A1 | 12/2010 | Gross et al. |
| 2010/0306165 | A1 | 12/2010 | Gross et al. |
| 2012/0030775 | A1 | 2/2012 | Gross et al. |
| 2018/0349797 | A1 | 12/2018 | Garvey et al. |
| 2019/0196892 | A1 | 6/2019 | Matei et al. |
| 2019/0197145 | A1 | 6/2019 | Gross et al. |
| 2019/0243799 | A1 | 8/2019 | Gross et al. |
| 2019/0286725 | A1 | 9/2019 | Gawlick et al. |
| 2019/0378022 | A1 | 12/2019 | Wang et al. |
| 2021/0158202 | A1 | 5/2021 | Backlawski et al. |
| 2021/0174248 | A1 | 6/2021 | Wetherbee et al. |

OTHER PUBLICATIONS

Dickey et al.; Checking for Autocorrelation in Regression Residuals; pp. 959-965; Proceedings of 11th Annual SAS Users Group International Conference; 1986.

Hoyer et al.; Spectral Decomposition and Reconstruction of Nuclear Plant Signals; pp. 1153-1158; published Jan. 1, 2005; downloaded on Jul. 14, 2021 from: https://support.sas.com/resources/papers/proceedings-archive/SUGI93/Sugi-93-193%20Hoyer%20Gross.pdf.

Kenny Gross, Oracle Labs; MSET2 Overview: "Anomaly Detection and Prediction" Oracle Cloud Autonomous Prognostics; p. 1-58; Aug. 8, 2019.

Whisnant et al; "Proactive Fault Monitoring in Enterprise Servers", 2005 IEEE International Multiconference in Computer Science & Computer Engineering, Las Vegas, NV, Jun. 27-30, 2005.

U.S. Nuclear Regulatory Commission: "Technical Review of On-Lin Monitoring Techniques for Performance Assessment vol. 1: State-of-the-Art", XP055744715, Jan. 31, 2006, pp. 1-132.

Gribok et al, "Use of Kernel Based Techniques for Sensor Validation in Nuclear Power Plants," International Topical Meeting on Nuclear Plant Instrumentation, Controls, and Human-Machine Interface Technologies (NPIC&HMIT 2000), Washington, DC, Nov. 2000 (1-15 pgs).

Gross et al, "Application of a Model-Based Fault Detection System to Nuclear Plant Signals," May 1, 1997 (5 pgs).

Singer, et al, "Model-Based Nuclear Power Plant Monitoring and Fault Detection: Theoretical Foundations," Intelligent System Application to Power Systems (ISAP '97) Jul. 6-10, 1997 Seoul, Korea (6 pgs).

* cited by examiner

DETECTION OF FEEDBACK CONTROL INSTABILITY IN COMPUTING DEVICE THERMAL CONTROL

CROSS REFERENCE TO RELATED APPLICATION

This disclosure is a continuation of and claims the benefit of priority to U.S. patent application Ser. No. 17/516,975, entitled "Detection of Feedback Control Instability in Computing Device Thermal Control," filed Nov. 2, 2021, and having inventors James ROHRKEMPER, Sanjeev R. SONDUR, Kenny C. GROSS, and Guang C. WANG, and which is incorporated herein by reference in its entirety for all purposes.

BACKGROUND

Enterprise-level computing servers can experience feedback-control instabilities in fan speeds and central processing unit (CPU) chip frequencies when regulating server temperature. The instabilities are inter-related insofar as spontaneous control oscillations for fan speed creates temperature oscillations in the CPUs, which trigger P-State oscillations in the CPUs. The P-State oscillations in the CPUs drive large oscillations in thermal dissipation, sensed by the controller for the fan speeds, creating a vicious cycle of "competition" oscillations. Thermal control oscillations create substantial wastage in energy for the servers, significantly lower compute performance, and degrade long term reliability for the servers from the rapid thermal oscillations.

A thermal controller for enterprise computing servers that detects and mitigates these feedback-control instabilities is therefore desired.

SUMMARY

In one embodiment, non-transitory computer-readable media associated with detecting feedback control instability (or confirming the absence thereof) in computer thermal controls are presented herein. For example, one or more non-transitory computer-readable media that include stored thereon computer-executable instructions. The computer-executable instructions, when executed by at least a service processor of a computing system cause the computing system to perform operations to detect feedback control instability in thermal control of the computing system. In particular, the computer-executable instructions cause the computing system to execute a workload on the computing system. The workload varies between a minimum and a maximum at a workload frequency. The computer-executable instructions also cause the computing system to record thermal telemetry from the computing system during execution of the workload. The computer-executable instructions cause the computing system to convert the recorded thermal telemetry into a frequency domain. The computer-executable instructions cause the computing system to detect whether thermal control of the computing system exhibits feedback control instability. The detection is based on dissimilarity in the frequency domain between the transformed thermal telemetry and the workload frequency. And, the computer-executable instructions cause the computing system to generate an electronic alert that indicates whether the thermal control of the computing device exhibits the feedback control instability.

In one embodiment, a computing system associated with detecting feedback control instability (or confirming the absence thereof) in computer thermal controls is presented herein. The computing system includes a one or more processing units. The computing system includes a service processor and memory configured to manage operations of the one or more processing units. The computing system includes a thermal control system configured to communicate thermal telemetry of the computing system to the service processor. And, the computing system includes one or more non-transitory computer-readable media operably connected to the service processor. The computer readable media include stored thereon computer-executable instructions. The computer executable instructions, when executed by at least the service processor accessing the memory cause the computing system to perform operations to detect feedback control instability in thermal control of the computing system. When executed, the computer executable instructions cause the computing system to execute a workload on the computing system. The workload varies between a minimum and a maximum at a workload frequency. The computer executable instructions cause the computing system to record the thermal telemetry during execution of the workload. The computer executable instructions cause the computing system to convert the recorded thermal telemetry into a frequency domain. The computer executable instructions cause the computing system to detect whether thermal control of the computing system exhibits feedback control instability. The detection is based on dissimilarity in the frequency domain between the transformed thermal telemetry and the workload frequency. And, the computer executable instructions cause the computing system to generate an electronic alert that indicates that the thermal control of the computing device either does or does not exhibit the feedback control instability.

In one embodiment, a computer-implemented method associated with detecting feedback control instability (or confirming the absence thereof) in computer thermal controls is presented herein. The method includes a step of executing a workload on a computing system. The workload varies between a minimum and a maximum at a workload frequency. The method includes a step of recording thermal telemetry from the computing system during execution of the workload. The method includes a step of converting the recorded thermal telemetry into a frequency domain. The method includes a step of confirming that thermal control of the computing system does not exhibit feedback control instability. The confirming is based on similarity in the frequency domain between the transformed thermal telemetry and the workload frequency. And, the method includes a step of generating an electronic alert that indicates the thermal control of the computing device to be free of the feedback control instability.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments one element may be implemented as multiple elements or that multiple elements may be implemented as one element. In some embodiments, an element shown as an internal component of another element may be implemented as an external component and vice versa. Furthermore, elements may not be drawn to scale.

DETAILED DESCRIPTION

Figure 1:
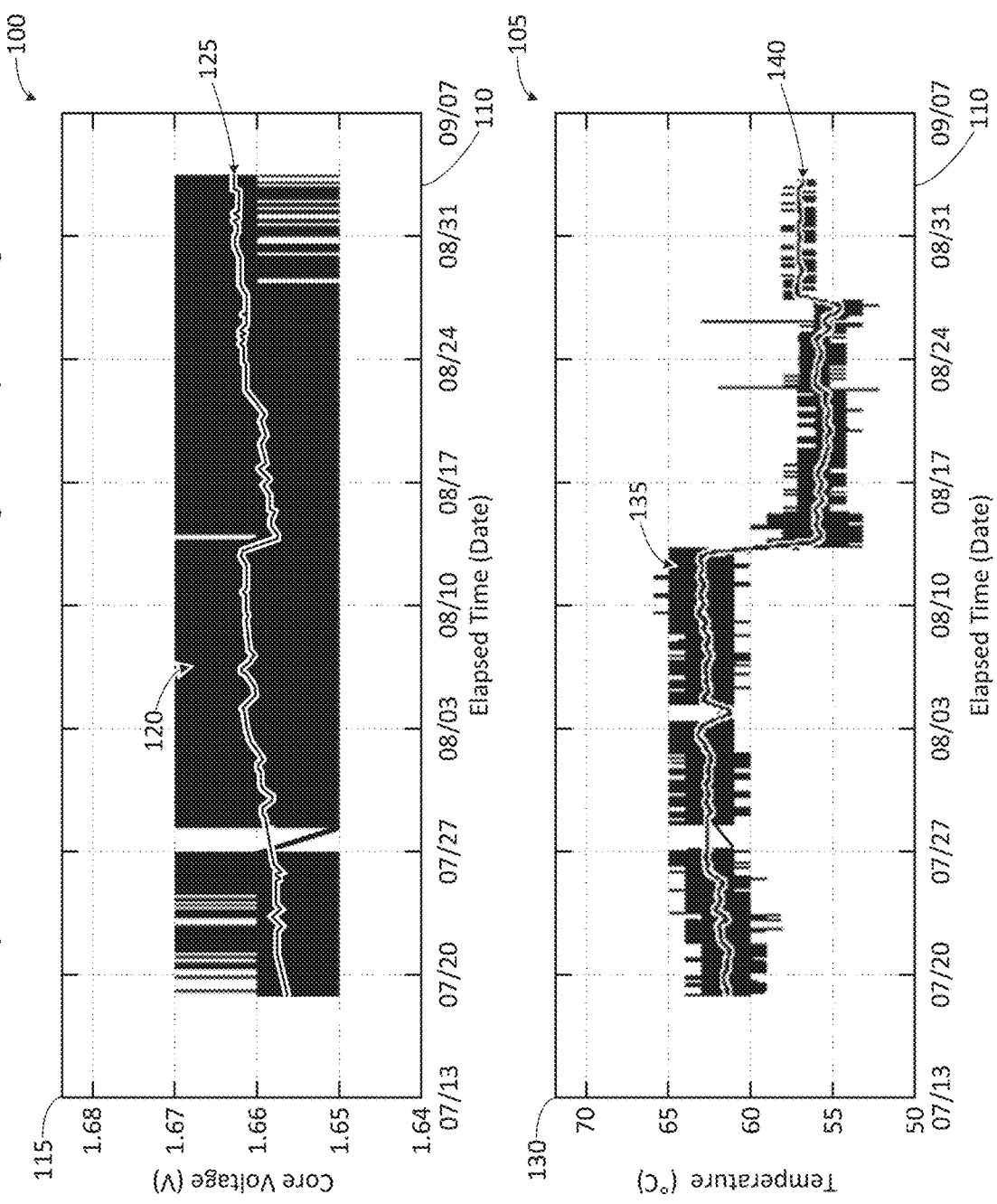
FIG. 1 illustrates an example of a quantization problem in both a voltage plot and a temperature plot.

Systems, methods, and other embodiments are described herein that provide telemetry-enabled thermal dynamic stability assurance for enterprise servers. The systems, methods, and other embodiments described herein provide detection of feedback control instability in computing device thermal control. The systems, methods, and other embodiments described herein further provide confirmation and assurance of feedback control stability in computing device thermal control. Advantageously, both detection of instability and confirmation of stability are achieved autonomously by the systems, methods, and other embodiments described herein. In another advantage, the systems, methods, and other embodiments described herein provide both detection of instability and confirmation of stability without modification to existing computing device hardware.

No action or function described or claimed herein is performed by the human mind. An interpretation that any action or function can be performed in the human mind is inconsistent with and contrary to this disclosure.

Example Thermal Stability Assurance System

In one embodiment, a computing device (such as an enterprise server 800) is configured with a thermal stability assurance system. The thermal stability assurance system operates to autonomously detect feedback control instability in thermal control systems of the computing device (or alternatively autonomously confirm that feedback control instability is absent from the thermal control systems of the computing device). In one embodiment, the thermal stability assurance system is integrated with the computing device. The computing device includes main processing units (e.g., processors 845), main memory (e.g. memory modules 850), and main I/O components (e.g., I/O components 855). The computing device also includes a service processor module (e.g., service processor module 805) including a service processor (e.g., service processor 810) and memory (e.g., memory 815) configured to manage operations of the main processing units and other main components of the computing device. The computing device also includes a thermal control system (for example including temperature sensors 870, P-state systems 865, and fan controllers 880) that is configured to communicate thermal telemetry of the computing system to the service processor (e.g., through I2C bus 890). And, the computing device includes one or more non-transitory computer-readable media operably connected to the service processor (e.g., storage 820). The non-transitory computer-readable media include stored instructions or logic for detection of feedback control instability in thermal control (e.g., instability detection logic 840). When executed by the service processor and memory, the instructions cause the computing system to execute a thermal stability assurance method that detects feedback control instability in thermal control of thermal control for the computing system.

In one embodiment, the thermal stability assurance method executes a workload on the computing system, for example as discussed below with reference to instability detection logic 940 and block 910. The workload varies between a minimum and a maximum at a workload frequency (or, alternatively, during a workload period). The thermal stability assurance method records the thermal telemetry during execution of the workload, for example as discussed below with respect to telemetry archive 835 and blocks 915, 1010, and 1030. The thermal stability assurance method converts the recorded thermal telemetry into a frequency domain, for example as described with reference to blocks 930 and 1055. The thermal stability assurance method detects whether thermal control of the computing system exhibits feedback control instability. The detection is based on dissimilarity in the frequency domain between the transformed thermal telemetry and the workload frequency—in particular, peaks in the power spectral density curve of the transformed thermal telemetry that do not align with the workload frequency, as described with reference to block 930. And, the thermal stability assurance method generates an electronic alert message that indicates whether the thermal control of the computing device exhibits the feedback control instability, for example as described with reference to blocks 930.

In one embodiment, when executing the workload, the thermal stability assurance method iteratively, until a thermal inertia threshold for the workload frequency is reached: (i) maintains the workload frequency (or, alternatively, the workload period) of the workload at a frequency value (or, alternatively, period value) during a dwell time interval, and (ii) incrementally increases the frequency value (or, alternatively, decreases the period value) following the dwell time interval, for example as discussed with reference to blocks 910, 920, and 925. In one embodiment, the threshold is a thermal inertia threshold—a level of temperature variation beyond which a temperature of the computing system is insufficiently responsive to the variance of the workload due to thermal inertia, as discussed with reference to block 925 and 1060. For example, the thermal inertia threshold is that an observed change in a sensed temperature of the computer system is less than three degrees Celsius over the dwell time interval. In one embodiment the threshold is a sampling rate threshold of twice the sampling rate of telemetry, as discussed with reference to blocks 920, 925, and 1050.

In one embodiment, executing the workload further includes switching the computing system between a minimum utilization state and a maximum utilization state to effect a sinusoidal pattern of workload at the workload frequency by pulse width modulation, for example as discussed with reference to instability detection logic 840 and block 910.

In one embodiment, the thermal control system includes (i) one or more temperature sensors (e.g., temperature sensors 870) configured to sense a temperature of the computing system, (ii) a power management system (e.g., P-state systems 865) configured to select a p-state for one or more components of the computing system, and (iii) one or more fan controllers (e.g. fan controllers 880) configured to select a fan speed of one or more fans of the computing system. The sensed temperature, P-state, and fan speed are included in the thermal telemetry, as discussed at block 915 and with reference to enterprise server 800. The detection by the thermal stability assurance method of whether thermal control of the computing system does or does not exhibit feedback control instability is based, at least in part, on one or more of the sensed temperature, P-state, and fan speed, for example as discussed at blocks 930 and 1055.

In one embodiment, when converting the recorded thermal telemetry into the frequency domain, the thermal stability assurance method performs moving-window fast Fourier transforms of the workload frequency and the recorded thermal telemetry, as discussed with reference to block 930. And, when detecting whether thermal control of the computing system exhibits feedback control instability, the thermal stability assurance method detects the feedback control instability where there is a power spectral density peak in thermal telemetry at a frequency other than the workload frequency, as discussed with reference to block 930. Or, when confirming that that thermal control of the computing system does not exhibit feedback control instability, the thermal stability assurance method determines that there are no power spectral density peaks in the recorded thermal telemetry that do not coincide with power spectral density peaks in the workload frequency, as discussed with reference to block 930.

In one embodiment, the thermal stability assurance method confirm that the thermal telemetry is accurate (e.g., that temperature sensors are operating correctly) based on similarity between the thermal telemetry and estimates of correct thermal telemetry generated by a machine learning model, for example as discussed with reference to block 1035, 1040, and 1045.

Additional detail on detection of feedback control instability in computing device thermal control performed by the thermal stability assurance system is presented herein. In one embodiment, configuration of a computing system incorporate the thermal stability assurance system will be described with reference to enterprise server 800 shown in FIG. 8. In one embodiment, operations of the thermal stability assurance system will be described with reference to methods 900 and 1000 shown in FIGS. 9 and 10, respectively.

—Context—

Intelligent, stable feedback-control algorithms have taken on a completely new importance in the field of enterprise computing systems for recent and future chip designs. As used herein, an "enterprise server" or "enterprise computing system" refers to a computing device configured with compute hardware to process heavy workloads (for example, workloads at the scale of an enterprise, instead of at the scale of an individual user) at high speed with high reliability, for example by having high processing throughput, large memory and/or storage. Some enterprise servers are configured to be managed as part of a group in a datacenter. Examples of enterprise servers include (but are not limited to) Oracle® Exadata, Dell PowerEdge, Fujitsu Primergy and Primequest, IBM Power System, and HP Proliant server computers. Each of these enterprise servers can be improved by implementation of the systems, methods, and other embodiments for detection of feedback control instability in computing device thermal control described herein.

Before the past decade, almost no feedback-control loops were used for thermal control in enterprise servers. Rudimentary control actuators were used for thermal protection, for example: if an internal temperature exceeds a threshold (in some systems, a 'thermtrip' threshold), shut the system down so it does not catch fire; or, if a motherboard voltage exceeds a high/low threshold, shut the motherboard down because the power supply is defective.

Recently, designers and manufacturers of enterprise servers have adopted variable-speed fans for cooling servers used in on premises and cloud datacenters. For most of the history of enterprise computing, fans for cooling the server ran at a single speed for the life of the system. A few high-end servers during the 2000-2010 decade had fans that generally operated at a single speed when the server operated below a threshold indicating excessive temperature, and if that threshold was crossed, would operate temporarily at a higher, emergency speed until the temperature returned below the threshold or a repair could be made.

For the decades in which there were no feedback-control algorithms inside servers, ample cooling systems were provided to keep the system cool under all anticipated operating conditions, and the electricity cost for the cooling was of very little concern. This meant that servers were actually over-cooled because the nominal fan speed was set high enough that the internal components would meet thermal reliability specs even where (i) the server is continuously running a maximum workload, (ii) the server is in a high-altitude data center where the air is thinner and has less cooling capability, and (iii) the ambient air temperature is at the high end of allowable ambient temperature specs.

This overly-conservative cooling specification meant that most of the servers in the world—those operating at lower altitudes in comfortable ambient environments and not running maximum workloads—would be wasting energy. Energy consumption for fan motors goes up with the cubic power of the fan rotations per minute (RPM). Moreover, servers with overly-conservative cooling generate much higher acoustic noise (which increases with the fifth power of the fan RPM) and generate higher vibration levels. Today's disk drives have become hypersensitive to even low vibration levels, such that vibration such as that caused by cooling fans degrades performance of I/O-intensive workloads.

For these reasons designers and manufacturers of enterprise servers now provide variable speed fans in server platforms, enabling savings of substantial energy across a population of servers while significantly reducing acoustics and vibrations. This has created a need for effective feedback-control algorithms to ensure that internal components remain within a temperature range defined by reliability specifications regardless of: (i) the workload on the internal CPUs, memory, and/or I/O components, (ii) altitude of the data center, and (iii) the ambient air temperature in the data center.

A second recent development that has created a need for good feedback-control algorithms is CPU power management (PM). The overwhelming majority of processing chips (including all Intel, AMD, IBM, Fujitsu, Oracle® SPARC, and ARM chips) now actively adjust the chip power level through dynamic frequency and voltage scaling (DVFS). PM can be employed for "thermal capping"—that is, to keep processing chips below a target temperature. PM can also be employed for "power capping"—that is, to keep a server below a target power consumption threshold—in order to avoid circuit breaker trips or brownouts or to keep power costs down.

Both variable fan speeds and chip PM conserve energy, but also created new feedback-control challenges that remained unresolved by the enterprise computing industry until the systems and methods described herein. Further, there are unique challenges presented by enterprise servers that render feedback-control algorithms used in other process environments unsatisfactory for use in enterprise server environments. It is extremely nontrivial to implement a feedback/control algorithm that meets the following functional requirements presented by an enterprise server:

(1) optimization of energy utilization across both the cooling fans as well as the processing chips—for perspective: (i) the thermal flux (for example measured in BTU per square centimeter) at the surface of modern CPUs is greater than the thermal flux at the surface of nuclear fuel elements, and (ii) server cooling fan motors have become so powerful that in many servers, the power budget for the fan motors is greater than the power budget for the CPUs;

(2) maintenance of internal temperatures under predefined threshold(s) dictated by reliability specifications;

(3) maintenance of temperatures as high as safely possible under the predefined threshold(s) to avoid wasteful overcooling, even when workload fluctuates chaotically; and (4) accommodation of hysteresis, that is, the feedback-control algorithm does not go into spontaneous oscillations under any possible end-user conditions.

The unique challenges that arise in enterprise servers making it nontrivial to simply adapt an off-the-shelf control algorithm for thermal regulation that meets the above functional requirements throughout the life of the server include: (i) quantization of sensor signals, (ii) time lags between physical transducers and control firmware, (iii) time varying flow impedance in parallel cooling zones, (iv) competition among local controllers in servers, and (v) non-synchronicity of telemetry metrics. Each of challenges (i)-(v) is a mechanism by which the temperature feedback control of an enterprise server can enter unstable control oscillations.

Quantization of sensor signals—that is, mapping of sensed values from the analog sensor output to digital values within a finite set—presents a challenge to control of thermal regulation in enterprise servers. Most enterprise computer servers have standardized on the use of 8-bit analog-to-digital converter (ADC) chips for physical sensors. As a result, physical variables (voltages, currents, temperatures, fan speeds) are severely quantized, being represented by at most 256 ($2^8$) discrete values. Quantization causes large uncertainties in computed power metrics and causes jitter instabilities in feedback-control loops.

FIG. 1 illustrates an example of the quantization problem in both a voltage plot 100 and a temperature plot 105. Voltage plot 100 shows example telemetry values for processor core voltage plotted against a time axis 110 and a core voltage axis 115. Quantized voltage signal 120 shows the raw voltage variable reported from the 8-bit ADC chips. The voltage variable is quantized at one tenth of a volt. Non-quantized voltage signal 125 shows the raw voltage variable at higher resolution. Temperature plot 105 shows example telemetry values for processor core temperature plotted against time axis 110 and a core temperature axis 130. Quantized temperature signal 135 shows the raw temperature variable reported from the 8-bit ADC chips. The temperature variable is quantized at one tenth of a degree Celsius. Non-quantized temperature signal 140 shows the raw temperature variable at higher resolution. The evident jumps in the quantized values 120, 135 due to minor changes in the non-quantized values 125, 140 shows clearly how jitter is introduced into feedback-control based on quantized signals. The systems, methods, and other embodiments for detection and mitigation of feedback control instability in computing device thermal control described herein overcome this quantization challenge, as shown and described herein.

Recent enterprise servers have been upgraded to 10- and 12-bit ADC chips in an effort to reduce quantization levels. But, in some cases, while the ADC hardware chips are capable of offering higher-resolution, system designers have chosen instead to spread the available bits over a larger signal range, leaving the reported signals still quantized. In other cases, the signals are un-quantized at the point of sensing, but when the signals are digitized in the ADC chips, the "downstream" intelligent platform management interface (IPMI) and/or integrated lights out manager (ILOM) firmware truncates the signals and imposes quantization. Thus, the systems, methods, and other embodiments for detection of feedback control instability in computing device thermal control described herein will benefit all enterprise computing servers, even those for which higher-resolution ADC chips have been designed into the product.

Time lags between physical transducers (sensors) and control firmware produce present another challenge to thermal feedback control in enterprise server environments. In many enterprise servers, thermal control algorithm firmware executed by a service processor (SP) receives temperature telemetry, evaluates it for temperature anomaly, and issues commands to a fan controller to operate the variable-speed fans in the server to remove excess heat.

In many enterprise servers, such as those used in cloud and on-premises datacenters, there is a significant (multiple-second) delay between the instant at which telemetry metrics are sensed and the time when the metrics make their way through a system bus to the SP for evaluation by thermal control algorithm firmware. For example, the telemetry metrics may be sent to the SP through an inter-integrated circuit ($I^2C$) system bus, which has limited-bandwidth. The delay in transmission of thermal telemetry metrics through the $I^2C$ bus introduces lag into the thermal feedback control loop.

Figure 2:
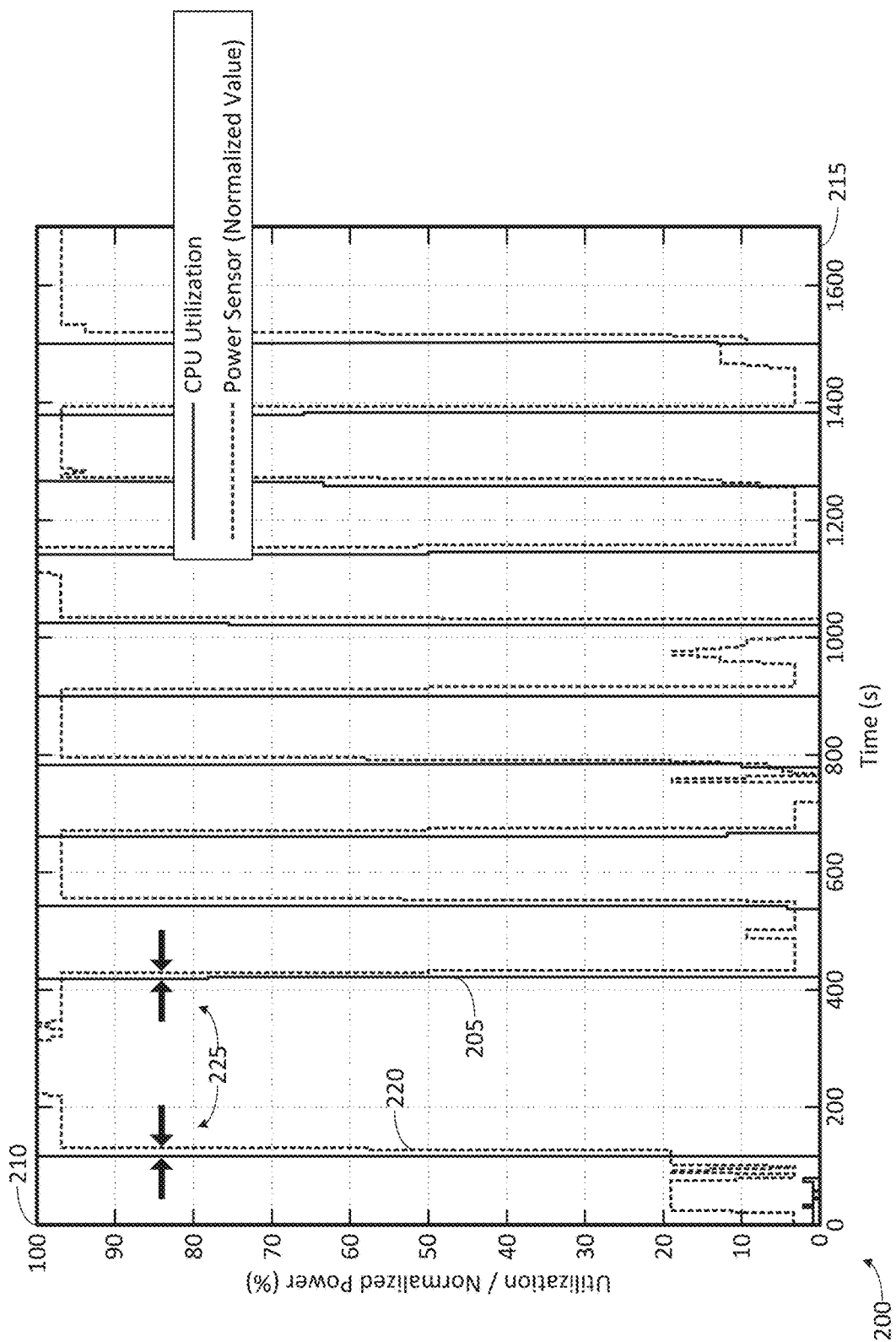
FIG. 2 illustrates a plot of measured system bus delay in the example enterprise server showing time lags between physical transducers and control firmware.

An experiment was conducted to measure $I^2C$ system bus delay in an example recent-model enterprise server. FIG. 2 illustrates a plot 200 of measured system bus delay in the example enterprise server showing time lags between physical transducers and control firmware. The experimental procedure drove repeated square wave impulses in CPU load 205. CPU load (utilization) 205 is shown as solid line plotted against a utilization/normalized power axis 210 (measured in percentage) and a time axis 215 (measured in seconds). The experimental procedure also monitored the CPU power 220 reported at the outlet of the $I^2C$ pipe. CPU power 220 is shown as a dotted line plotted against utilization/normalized power axis 210 time axis 215. The elapsed time (delta-T) 225 between impulse in load 205 (solid line) and response in power 220 (dashed line) equals $I^2C$ latency. As shown in plot 200, mean elapsed time between utilization impulse and the response at the outlet of the $I^2C$ pipe of the example enterprise server is a latency of 12 seconds. Thus, the experiment measured delay due to I²C system bus transmission to be 12 seconds. A 12 second delay exacerbates the challenge to having stability assurance in fan-speeds as well as P-States.

Lags in a feedback-control algorithm may cause control oscillations. Because the thermal control algorithm receives temperature telemetry at the output side of the I²C system bus, this means that the commands to the fan controller are attempting to cool thermal perturbations that happened multiple seconds ago. By the time the fan speeds do go up in response to the increased temperature due to increased load on a CPU, the increase in cooling air now lowers the CPU temperatures, causing the P-States (processing power cap states) in the CPUs to sense that the thermal headroom margins are significantly larger, raising the CPU frequencies, thereby increasing thermal dissipation that the fan controllers will sense seconds later, thereby creating a vicious cycle of competition oscillations.

We note that, although the I²C system bus is slow, it is an industry standard architecture that interfaces with many components of enterprise servers. The I²C system bus is therefore unlikely to be replaced for communication of temperature telemetry despite the disadvantages. Accordingly, the systems, methods, and other embodiments described herein for mitigation of feedback control instability in computing device thermal control overcomes the problems introduced by I²C system bus without altering or replacing the bus in server system architecture, as shown and described herein.

Time-varying flow impedance in parallel cooling zones is another challenge to thermal feedback control in enterprise server environments. Early use of variable-speed fans in enterprise computing servers raised and lowered the speeds of all the fans in the server in unison. Thus, where CPUs would get warmer during times of high CPU utilization, the speeds would be raised for all fans in the server to assure that the CPUs remain sufficiently cool. Raising all fan speeds would cause components in other airflow zones, such as memory components or I/O components, to be over-cooled. This wastes energy. Consequently, more modern enterprise computing systems are now designed with separate control of fans for separate parallel cooling zones. Fans that cool the memory, CPUs, or I/O components may therefore be adjusted up or down independently as needed whenever the components in the respective zones get warmer or cooler. This effort to save energy by reducing over-cooling has created a new challenge to stability assurance: Time-varying flow impedance in parallel cooling zones.

When there is intermixing of airflow between or among the adjacent cooling zones or at an exit plenum where the airflow mixes from all zones, changes in flowrate in one zone influence the impedance—resistance to airflow—in parallel zones. Consider, for example, an example enterprise server partitioned into 3 parallel cooling zones: zones 1, 2, and 3. As the fan speeds are increased for zone 1, the impedance drops for zones 2 and 3. This means that even if the fans remain at a constant flow speed for zones 2 and 3, the cooling flowrate in cubic feet per minute (CFM) actually will passively increase, even with no change in control signals to the fans in zones 2 and 3. That makes the temperatures go down in zones 2 and 3 (after a delay due to thermal inertia). In response to the temperature reduction in zones 2 and 3, the fan speeds will drop in those zones, thereby increasing impedance in zone 1. Because changes in flowrate in one zone influence the impedance in parallel zones, this phenomenon can lead to undamped airflow provisioning oscillations between the parallel cooling zones.

In real-world example servers, the situation is even more complicated because there are many parallel cooling zones with separately controlled cooling. For example, in most present-day enterprise computing servers the power supply units (PSUs) are additionally equipped with variable speed fans. The output from the PSU fans additionally mixes with and alters the impedance for the cooling flow from the main fans. The systems, methods, and other embodiments described herein for mitigation of feedback control instability in computing device thermal control overcomes the problem of airflow provisioning oscillations between the parallel cooling zones due to time-varying flow impedance in the parallel cooling zones, as shown and described herein.

A further challenge to thermal feedback control in enterprise server environments is that competition between or among local controllers in servers leads to chaotic adjustments. An intractable stable-control challenge arises where multiple local controllers simultaneously control the same variable, such as, in this case CPU temperatures or CPU power levels. In modern enterprise servers, multiple local controllers may be implemented by separate design teams that attempt to control the same variables such as CPU temperatures or CPU power levels. For example, for chip temperatures, two types of controllers that are designed to keep chip temperatures below a limit that is set by package reliability specs are intelligent fan control (IFC) and chip power management (PM) that is implemented by DVFS in the form of P-states. P-states are fixed voltage-frequency states used to very rapidly control the CPU frequencies so that the chips do not melt or catch fire. In another example of a local controller helping control CPU temperatures, server design teams use variable-speed fans in the Power Supply Units (PSUs) to not only cool the PSUs, but to assist with cooling the CPU chips. That means that if the PSU fans go up/down in speed, that will also make the CPU chips cooler/warmer, and IFC and PM are also tied to that same temperature. Complete chaos ensues. It has been observed that if any two or more of the foregoing three local control strategies are simultaneously active, the server will suffer from control oscillations. The systems, methods, and other embodiments described herein for mitigation of feedback control instability in computing device thermal control prevents these oscillations, as shown and described herein.

Yet another challenge to thermal feedback control in enterprise server environments is non-synchronicity of telemetry metrics. As mentioned above, modern enterprise servers today use the industry standard I²C system bus architecture. The I²C system bus was designed decades ago, and has limited bandwidth, but due to maintaining compatibility with third party components, no new system bus architecture can be introduced. The lack of bandwidth in the I²C system bus is becoming a more significant challenge as enterprise servers become more sensor-dense (include more sensors). As recently as 10 years ago servers had a few dozens of internal sensors. Current servers may have well in excess of 500 internal sensors providing telemetry on a variety of server operational statuses. For example, Oracle's large M6 server (a refrigerator-sized enterprise server) has 3400 sensors. Although the number of internal physical sensors has gone up dramatically, the bandwidth for industry standard system bus has not increased. Consequently, even though there is a desire to sample all types of internal sensors synchronously, the reality is that there can be many seconds between when the first sensors are sampled and when sensors later in the I²C sampling scheme are sampled.

Because of this non-synchronicity of telemetry metrics, simultaneous thermal states inside a server can appear to the control structure to be significantly out of synchrony. Suppose for example, the enterprise server executes a workload that causes the memory, CPUs and I/O components to rise and fall in temperature simultaneously. Because of the significant delays between sampling of the sequence of sensors throughout the server, it could appear to the control modules that the components that get sampled latest in the I²C sampling scheme are lagging by many seconds behind components that are sampled early in the sampling scheme. Naïve control algorithms would adjust the parallel-zone fans to cool one set of components first and cool another set of components many seconds later, which of course gives rise to real leads and lags in cooling provisioning throughout the server. This control stability challenge is also overcome by the systems, methods, and other embodiments described herein for mitigation of feedback control instability in computing device thermal control, as described herein.

Investigation of data from server telemetry recorders such as Oracle's continuous system telemetry harness (CSTH) has revealed many cases of spontaneous oscillations in cooling provisioning as well as CPU dynamic-voltage-frequency-scaling (DVFS) power-management (PM) actuation in enterprise servers.

Figure 3:
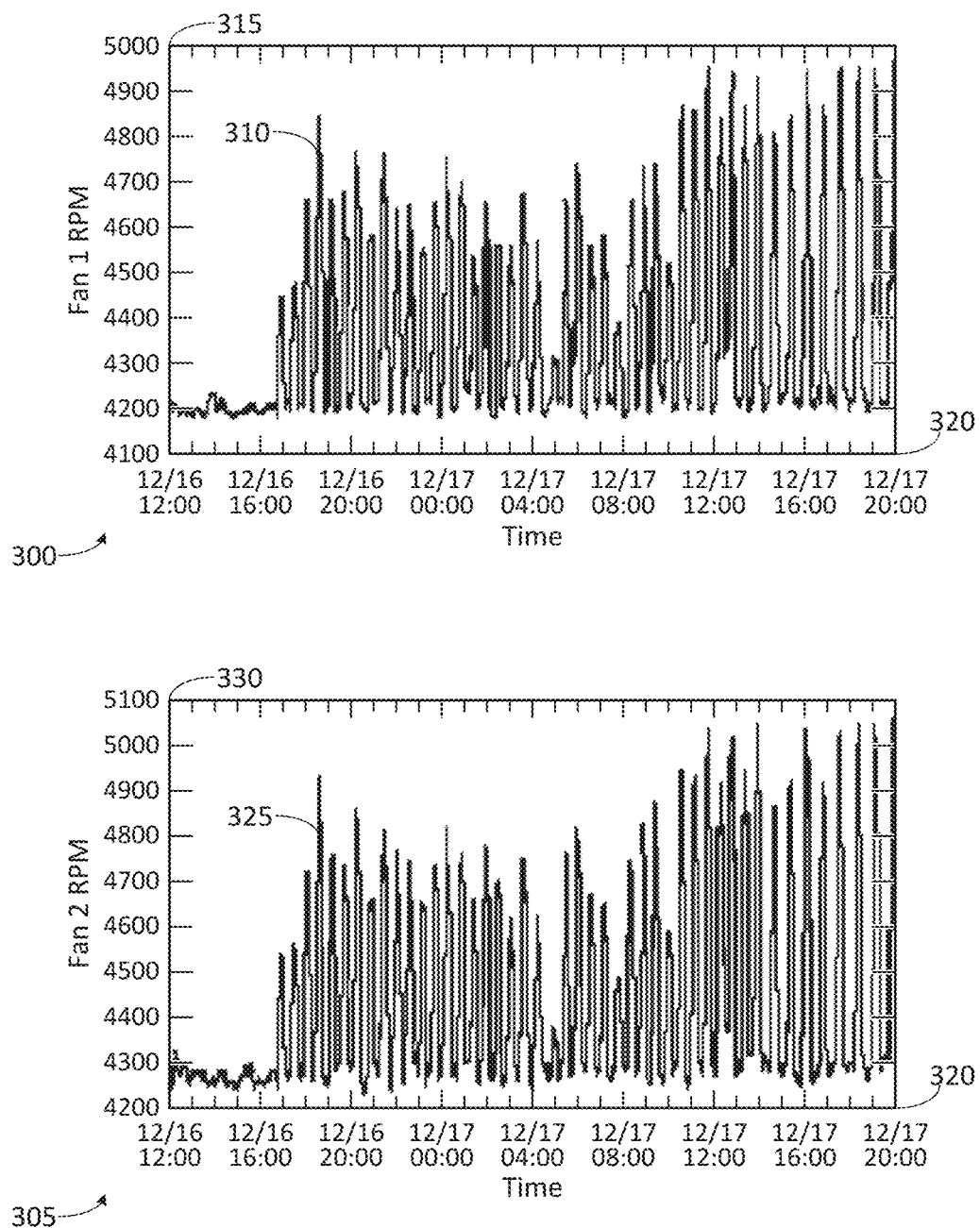
FIG. 3 illustrates a first plot and a second plot of a first fan and a second fan in an example enterprise server entering into spontaneous fan-speed oscillations.

FIG. 3 illustrates a first plot 300 and a second plot 305 of a first fan and a second fan, respectively, in an example enterprise server entering into spontaneous fan-speed oscillations. Rotation speed (RPM) of fan 1 310 is shown plotted against an RPM axis 315 and a time axis 320. Rotation speed (RPM) of fan 2 325 is shown plotted against an RPM axis 330 and time axis 320. The fans spontaneously commence their fan-speed oscillations beginning at about 3:45 PM on December 16 on the time axis. Telemetry recorder data on numerous platforms in the field shows that depending upon workloads, ambient inlet temperature, and datacenter altitude, fan speeds can unexpectedly and spontaneously enter sinusoidal oscillations, from which they are unlikely to spontaneously recover. Fan oscillations create thermal oscillations and amplified vibration, both of which are bad for long terms system reliability. Indeed, HDDs can be sensitive to excessive fan vibration, causing data access delays due to read/write head position errors. Fan oscillations additionally create acoustic issues, increasing noise with the fifth power of fan RPMs, and waste energy, increasing fan power consumption with the cubic power of fan RPMs.

Figure 4:
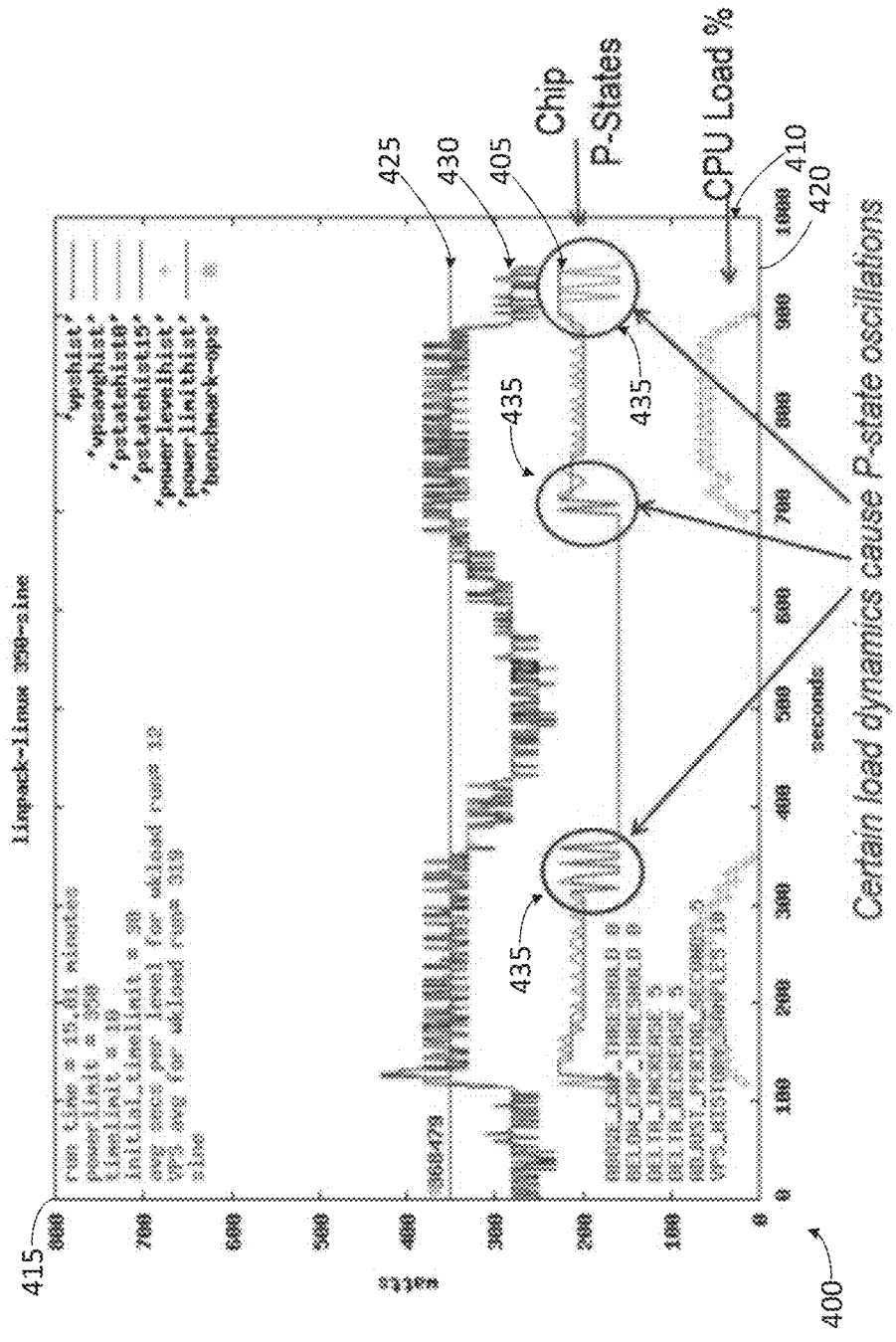
FIG. 4 illustrates a plot of P-state oscillations in a processor CPU chip in an example enterprise server.

FIG. 4 illustrates a plot 400 of P-state oscillations in a processor CPU chip in an example enterprise server. Chip P-state 405 and CPU load 410 are plotted against a power axis 415 (measured in watts) and a time axis 420 (measured in seconds). The chip power consumption is capped at 350 watts, as shown at cap line 425. The temperature sensed from the chip is shown at line 430. The power management (PM) capabilities—the P-states—of the processor chip used in the example enterprise servers go into oscillations 435 when the temperature is either increasing or decreasing through a "zone of instability".

Figure 5:
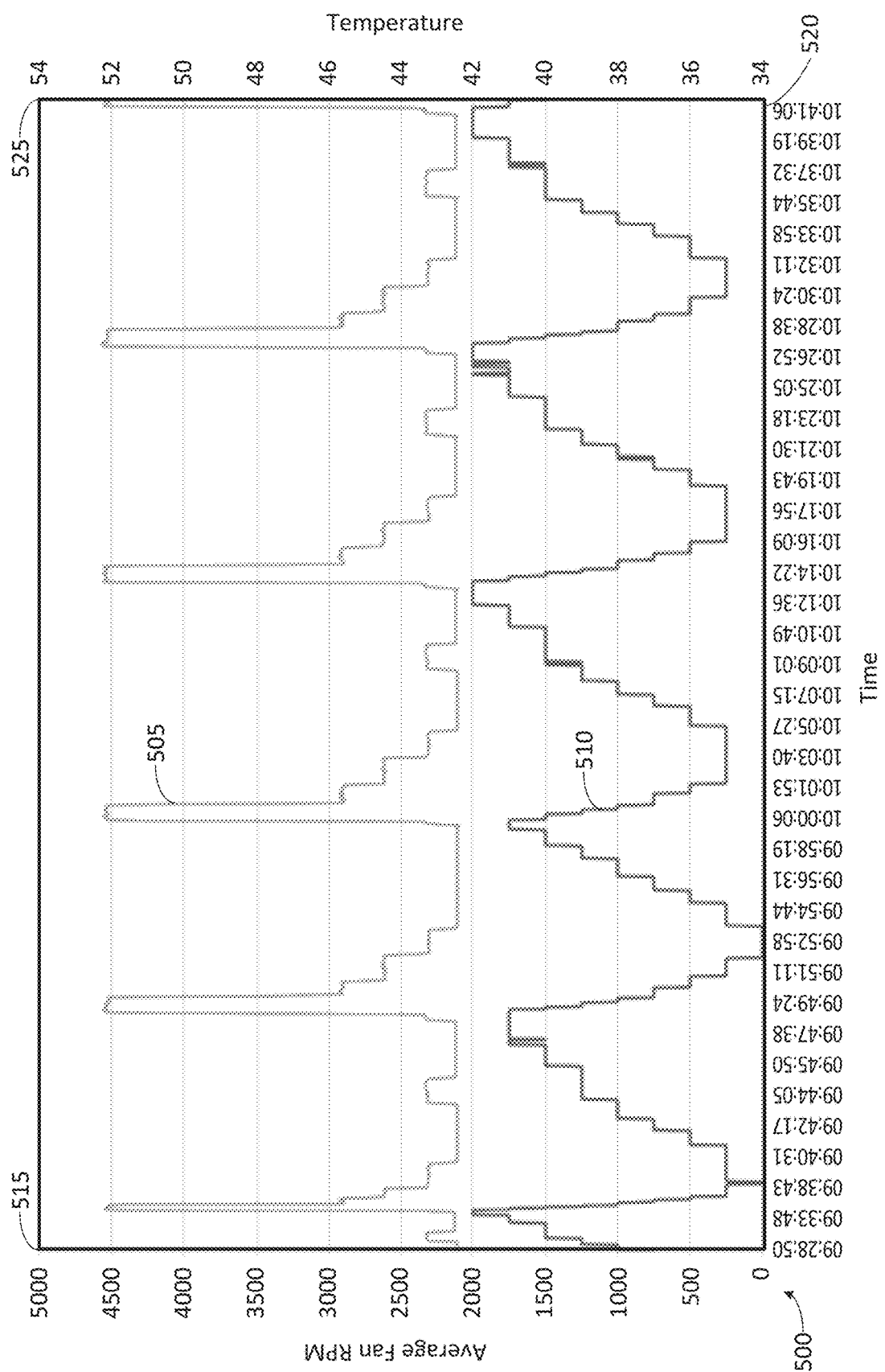
FIG. 5 illustrates a plot of fan speed and temperature for fan and thermal oscillations in example enterprise servers in a large data center.
Figure 6:
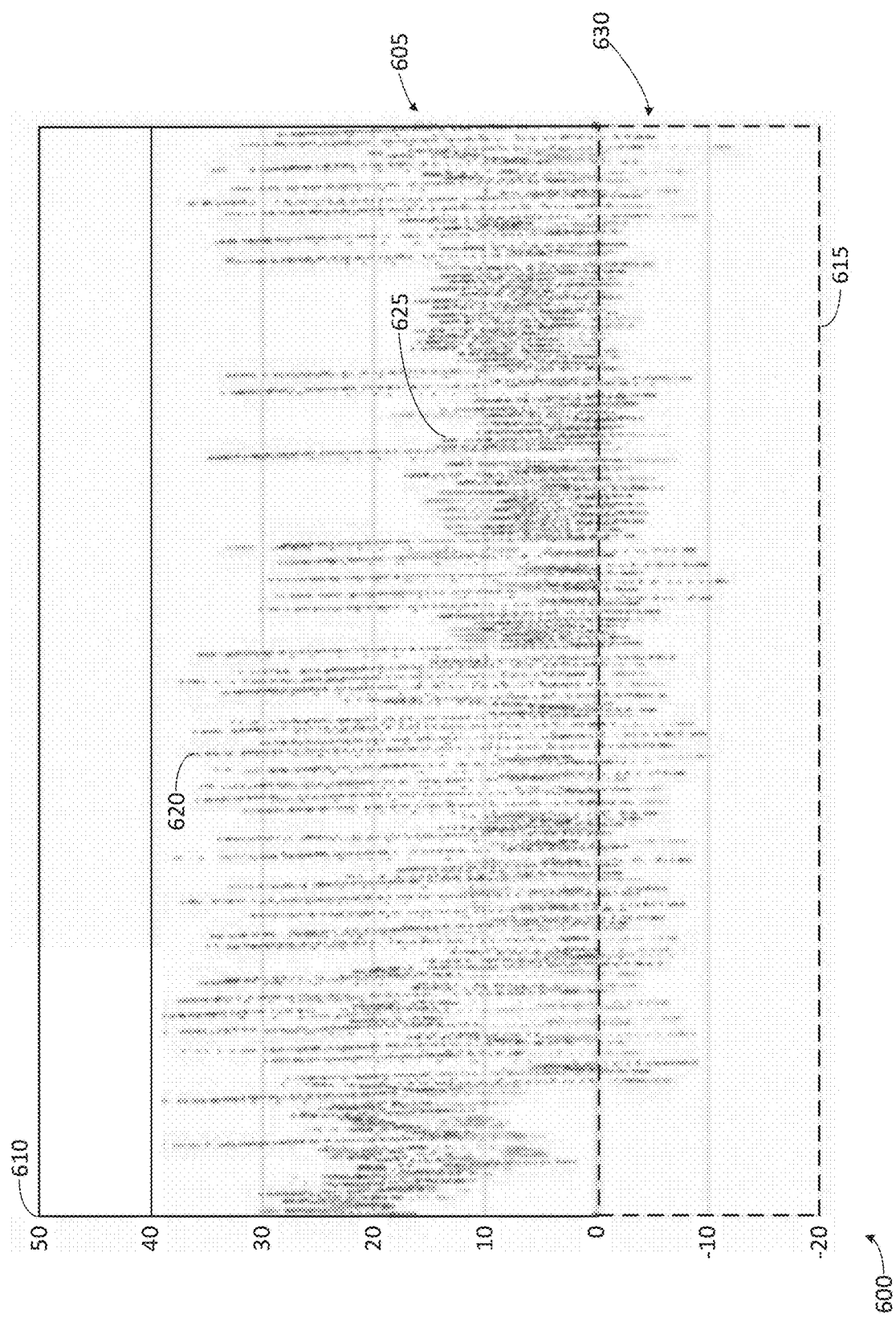
FIG. 6 illustrates a plot of example fan control oscillations in the example enterprise servers in the large data center.

FIG. 5 illustrates a plot 500 of fan speed 505 and temperature 510 for fan and thermal oscillations in example enterprise servers in a large data center. Fan speed 505 is plotted against an average fan rpm axis 515 and a time axis 520. Temperature 510 is plotted against a temperature axis 525 and time axis 520. FIG. 6 illustrates a plot 600 of example fan control oscillations in the example enterprise servers in the large data center. Margins 605 between chip thermal signal and the threshold that triggers DVFS power throttling in the chip are plotted against a margin axis 610 and a time axis 615. Two distinct instabilities are observed: a large cycle instability 620 having an approximate swing of 42 degrees Celsius, and a small cycle instability 625 having an approximate swing of 12 degrees Celsius. Where the margin is negative 630 (below zero on margin axis 660), DVFS processor power throttling commences. Where CPUs are oscillating in and out of processor power throttling mode, compute performance is reduced.

Figure 7:
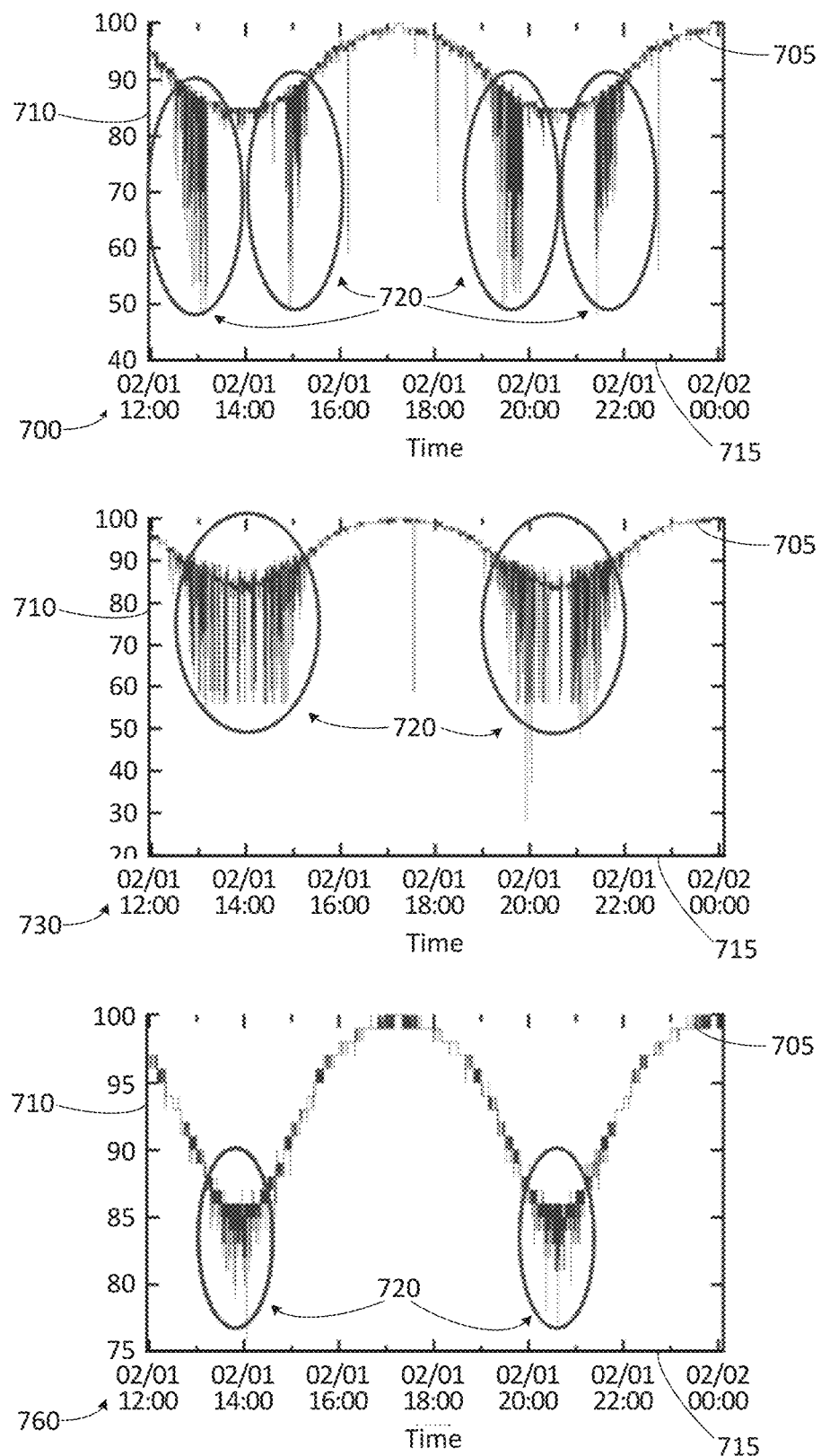
FIG. 7 illustrates several plots of P-state oscillations in an example enterprise server.

FIG. 7 illustrates several plots 700, 730, 760 of P-state oscillations in an example enterprise server. A sinusoidal workload is applied to the example enterprise server, causing the workload on the processor to vary in a sinusoidal pattern. Processor performance is plotted against a CPU performance axis 710 (normalized to 100% at 3.6 GHZ) and a time axis 715. At a certain point in the load cycle the processor enters a narrow temperature range where the P-states go into rapid oscillations throttling between one P-state and another, as shown within the ovals 720 on plots 700, 730, and 760. The significant drops in performance of the processor due to DVFS throttling oscillating between P-states appear in the downward spikes within the ovals 720.

Example Environment

Figure 8:
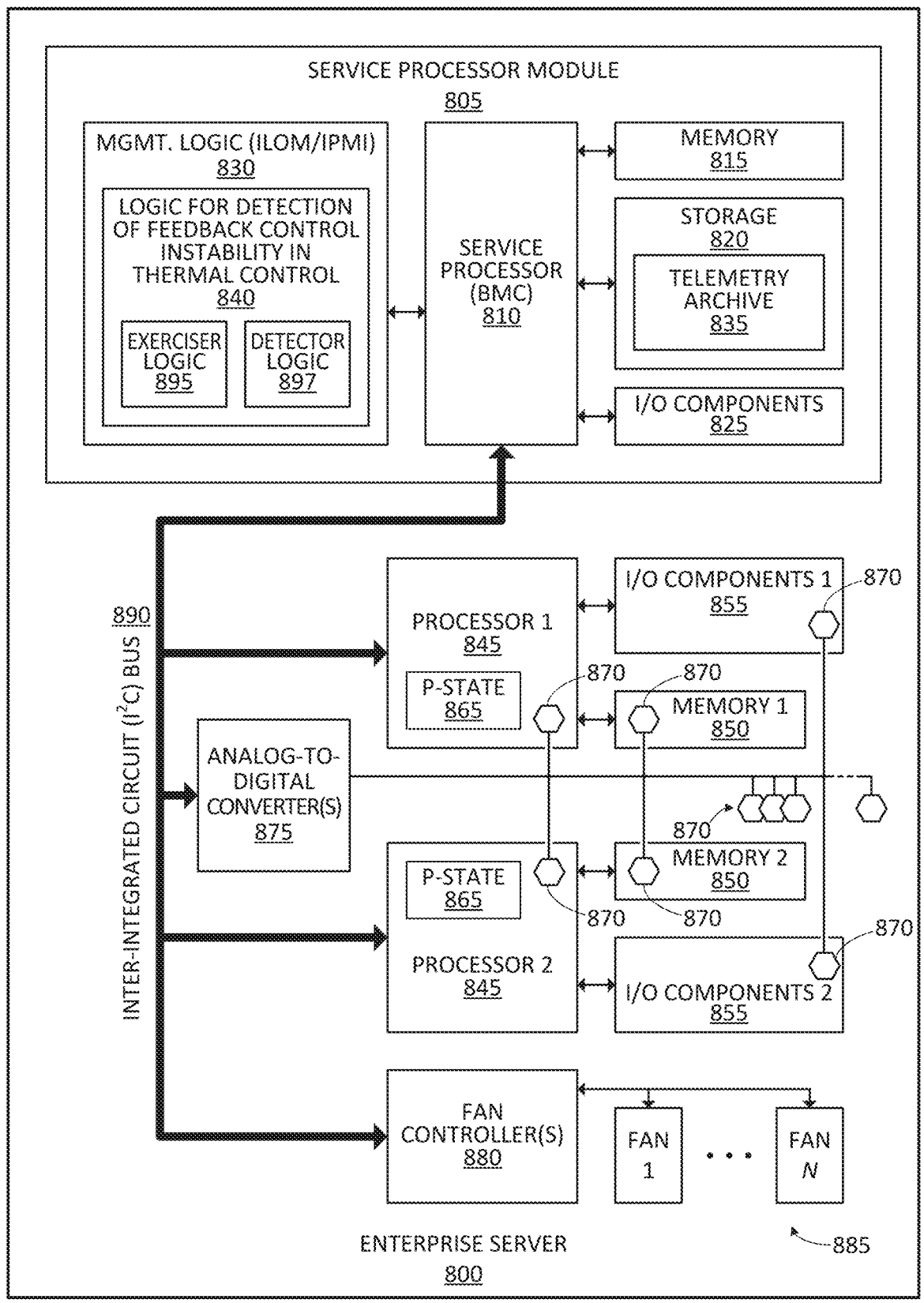
FIG. 8 illustrates one embodiment of an example enterprise server associated with detection of feedback control instability in computing device thermal control.

FIG. 8 illustrates one embodiment of an example enterprise server 800 associated with detection of feedback control instability in computing device thermal control. Enterprise server 800 includes, but is not limited to, a server computer, a server blade, and a datacenter server. For example, enterprise server 800 may be an Oracle® SPARC or x86 series server module.

Enterprise server 800 includes a service processor module 805 configured to manage a workload on enterprise server 800 and to monitor and record performance of enterprise server 800. Service processor module 805 includes a service processor (SP) or baseboard management controller (BMC) 810, memory 815, storage 820, I/O components 825, and server management logic 830 (such as the Oracle integrated lights out manager (ILOM) and intelligent platform management interface (IPMI) firmware/software). Storage 820 includes a telemetry archive 835. In one embodiment, telemetry archive 835 includes a real-time circular file for collecting incoming time-series telemetry signals in real time and a lifetime history file, to which compressed records of the real time file are transferred when the real-time circular file is full. In one embodiment, service processor module 805 is computing device similar to computing device 1105 (shown in FIG. 11) integrated with enterprise server 800, and specially configured with sensors and software to monitor the physical state of enterprise server 800, and to communicate with an administration network through network devices and included in I/O components 825. Management logic 830 includes logic for detection of feedback control instability in thermal control 840 (also referred to herein as instability detection logic) such as the methods shown and described herein, among other logic.

Enterprise server 800 includes main processors 845, main memory 850, main I/O components 855. In one embodiment, enterprise server 800 is a computing device similar to computing device 1105 (shown in FIG. 11), although specially adapted to execute heavy workloads. Main processors 845 each include a DVFS power management (P-state) system 865 for scaling or capping the frequency and voltage at which main processors 845 run (thereby reducing temperature). A P-state is one of a set of a discrete levels of frequency and voltage less than or equal to the maximum frequency and voltage consumption of main processor 845, and distributed across the range of frequencies and voltages between minimum and maximum available to main processor 845. P-state system 865 can limit the processor to less than maximum performance by setting a lower P-state for main processor 845, for example in response to excessive heat. In one embodiment, P-state systems 865 each implement P-state feedback control algorithms that determine when to shift main processor 845 operation between P-states. Main memory modules 850 and main I/O components 855 may also have a power management system. configured to scale or cap the frequency and voltage of their operation. Main processors 845, main memory 850 modules, and I/O components 855 generate telemetry data regarding their current operational state, such as power management state (P-state), load or utilization percentage, and power consumption level. Temperature sensors 870 are positioned in contact with or proximate to main processors 845, main memory 850 modules, and main I/O components 855, among other locations within enterprise server 800. The positions of temperature sensors are such that they can measure operating temperatures of main processors 845, main memory 850 modules, main I/O components 855, and other locations within enterprise server 800. Analog, transduced signals from temperature sensors 870 are provided to one or more analog-to-digital converters (ADC) 875, which generates digital telemetry data representing the analog temperature signals. Enterprise server 800 includes fan controller(s) 880, which is configured to manage (by increasing, decreasing, or maintaining) the speed of cooling fans 885, for example in response to commands generated by a feedback control loop. Fan controller 880 generates telemetry data representing operational states (such as fan rotation speed) of fans 885 managed by fan controller 880. Main processors 845, main memory 850 modules, main I/O components 855, ADC 875, and fan controller 880 are each communicatively coupled to a bus 890 (such as an I$^2$C bus), and transmit the telemetry data through bus 890 to service processor or baseboard management controller 810.

Instability detection logic 840 includes logic to cause main processors 845 to execute workload scripts, such as workloads that cause main processors 845, main memory modules 850, and/or main I/O components 855 to operate under a workload with a pre-determined load profile or pattern. For example, a workload script may cause one or more main components 845, 850, 855 to execute a workload that varies sinusoidally between a minimum (or idle) utilization state and a maximum utilization state over a period of time, or in other words, execute a sinusoidal workload with a particular period. The workload may continue to execute the workload for a dwell time, or period of time during which the period of the workload does not change. In one embodiment, the workload script is caused to increase and decrease utilization of one or more main components 845, 850, 855 in the pre-determined profile (such as a sinusoidal pattern) by pulse-width-modulation (PWM) load profiling. PWM load profiling modulates the load to different levels of processor (or other component) utilization by switching the load between a stop state, in which the load is not executed and remains suspended in memory, and a run state, in which the load is executed. Workload scripts may be stored in storage 820, and loaded by service processor 810 into main memory 850 for execution by main processors 845. In one embodiment, the instability detection logic 840 that causes main components 845, 850, 855 to execute workloads may be referred to as dynamic exerciser logic 895. Dynamic exerciser logic 895 parametrically stimulates all periods for all thermal feedback-control loops in enterprise server 800 with a workload that varies sinusoidally between minimum and maximum utilization. This stimulation places enterprise server 800 in all possible internal (that is, non-environmental) operating conditions—all possible permutations of dynamic frequency stimulation and response—thereby triggering any latent oscillations for subsequent detection. For example, a sinusoidal variance of the workload between minimum and maximum has been found to be effective at exhaustively covering all possible combinations of internal server temperatures and rates of change for those temperatures. By contrast, constant maximum load testing will achieve stable fan control while hiding those different conditions of temperature and rate of change in temperature that cause spontaneous cooling-provision oscillations and/or spontaneous P-state oscillations. In one embodiment, instability detection logic 840 is embedded during production for new servers because energy dynamics may differ from device to device.

Instability detection logic 840 includes detector logic 897 to cause service processor 810 to analyze telemetry recorded during the execution of a workload script to detect the presence of latent oscillation in a thermal feedback-control loop. The exercising of all possible operating conditions of the server by exerciser logic 895 enables instabilities to be both identified by comparison against the frequency of the workload, characterized—that is, described—as to their nature and the operating and environment conditions that cause them, and mitigated using this information.

Example Methods

In one embodiment, each step of computer-implemented methods described herein may be performed by a processor or combination of processors (such as processors 810, 845, and 1110 as shown and described herein) of one or more computing devices (i) accessing memory (such as memory 815, 850, and 1115 and/or other computing device components shown and described herein) and (ii) configured with logic to cause the system to execute the step of the method (such as logic for detection of feedback control instability in thermal control 840 and 1130 shown and described herein). For example, the processor accesses and reads from or writes to the memory to perform the steps of the computer-implemented methods described herein. These steps may include (i) retrieving any necessary information, (ii) calculating, determining, generating, classifying, or otherwise creating any data, and (iii) storing for subsequent use any data calculated, determined, generated, classified, or otherwise created. The processor may read and store temperature and other telemetry data indicating physical state of the computing device received from a telemetry bus (such as I$^2$C bus 890). References to storage or storing indicate storage as a data structure in memory or storage/disks of a computing device (such as memory 815, 850, 1115, or storage/disks 820, 1135, or in or in data stores accessible over a network).

In one embodiment, each subsequent step of a method commences automatically in response to parsing a signal received or stored data retrieved indicating that the previous step has been performed at least to the extent necessary for the subsequent step to commence. Generally, the signal received or the stored data retrieved indicates completion of the previous step.

Figure 9:
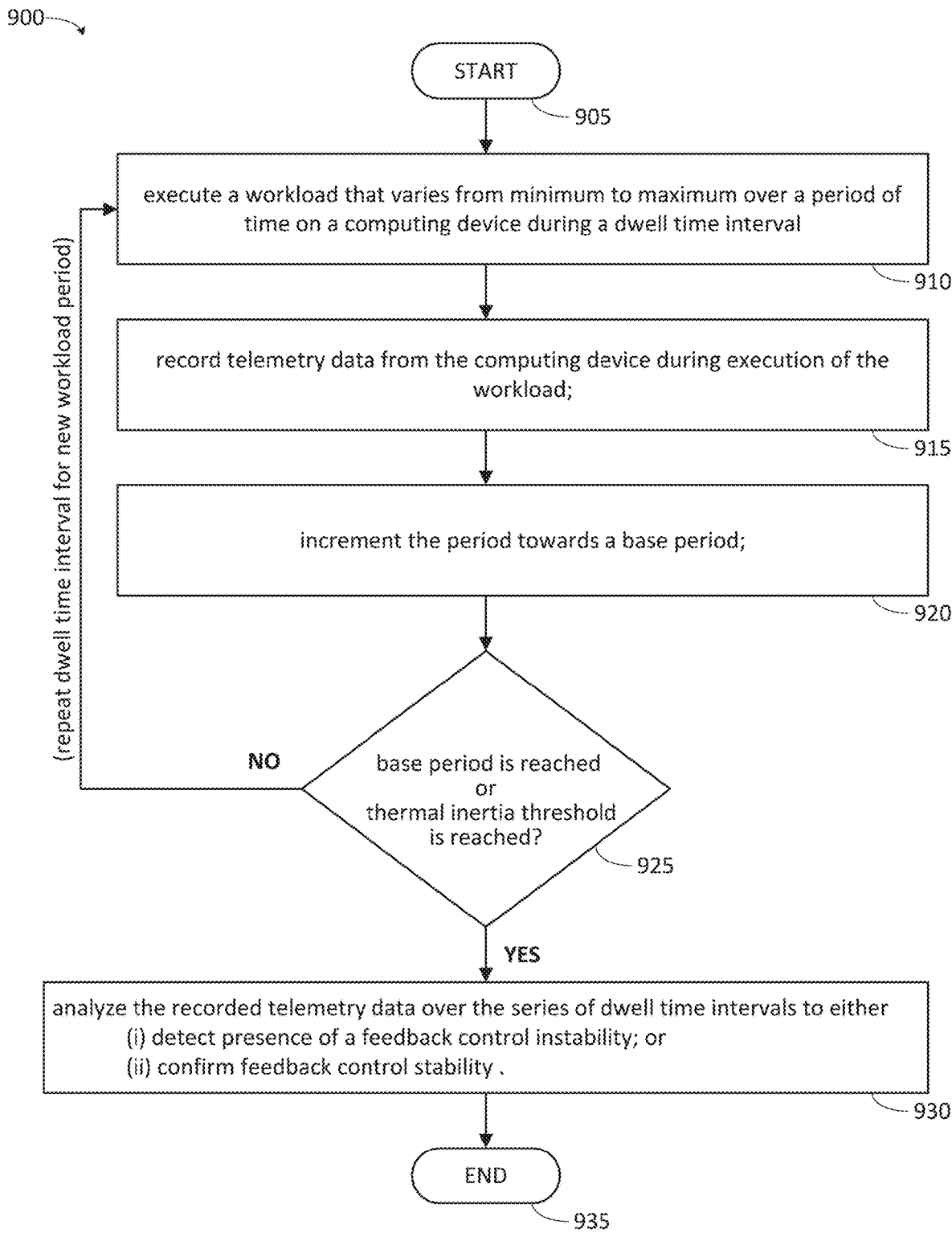
FIG. 9 illustrates one embodiment of a method associated with detection of feedback control instability in computing device thermal control.

FIG. 9 illustrates one embodiment of a method 900 associated with detection of feedback control instability in computing device thermal control. In one embodiment, the steps of method 900 are performed by service processor module 805 (as shown and described with reference to FIG. 8). In one embodiment, service processor module 805 is a special purpose computing device (such as computing device 1105) configured with logic for detection of feedback control instability in thermal control 1130. In one embodiment, service processor module 805 is a module of a special purpose computing device configured with logic 1130. In one embodiment, service processor module 805 is a computing hardware module integrated with main computing hardware module(s) of a server computing device. In one embodiment, detection of latent thermal feedback-control instabilities or oscillations is enabled by the steps of method 900, where such detection was not previously possible to be performed by computing devices.

In one embodiment, user interaction with the method, including accepting inputs and displaying or receiving alerts and other output messages, may be performed using a graphical user interface. In one embodiment, the graphical user interface is web application or dedicated application executing on a computer remote from the computing device executing method 900. The remote computer may be connected by a network to the computer executing the method. For example, the remote computer may be connected through a management network to a network interface I/O component 825 of service processor module 805.

The method 900 may be initiated automatically based on various triggers, such as in response to receiving a signal over a network or parsing stored data indicating that (i) a user (or administrator) of enterprise server 800 has initiated method 900, (ii) that method 900 is scheduled to be initiated at defined times or time intervals, (iii) that hardware configuration of enterprise server 800 has changed, (iv) that firmware (including thermal control firmware) has changed, or (v) feedback-control instabilities have been observed in thermal control for enterprise server 800. The method 900 initiates at START block 905 in response to parsing a signal received or stored data retrieved and determining that the signal or stored data indicates that the method 900 should begin. Processing continues to process block 910.

At process block 910, the processor executes a workload that varies from minimum to maximum over the period of time on a computing device during a dwell time interval.

In one embodiment, process block 910 begins a loop that repeats for a series of dwell time intervals. During a dwell time interval, the period of the workload (the period of time) remains consistent. In one embodiment, the dwell time interval is equal to or greater than the period of the workload. A dwell time interval is associated with a particular workload period in that the period of time in which the workload completes one cycle is different for each of the dwell time intervals. The period of time starts at an initial period of time (in one embodiment, a longer period of time). In one embodiment, the dwell time interval is a constant (H) pre-selected prior to beginning method 900. In one embodiment, the dwell time interval may vary proportionally with the period of time, for example, a dwell time interval of approximately 5 cycles of the workload (5 periods). Thus, the loop repeats for a set of dwell time intervals, where the dwell time intervals are associated with a range of periods of time from an initial period to a base period.

In one embodiment, the processor (such as the service processor 810) generates or retrieves a previously generated workload for execution by main hardware components 845, 850, 855. In one embodiment, the workload is generated as a PWM load profile that modulates the load on the hardware in a sinusoid having the workload period (period of time). These workloads may be pre-generated, with a workload for each different period, and stored in storage 820. In one embodiment, the workload with a period associated with a particular dwell time interval may be retrieved by service processor 810 from storage 820. In one embodiment, service processor module 805 and causes the retrieved workload to be executed by main hardware during the dwell time interval, for example by making an application programming interface (API) call or executing a command that instructs the main processor to execute the workload.

In one embodiment, the workload is at least one of a workload on a central processing unit such as main processors 845, a workload on memory such as main memory modules 850, or a workload on I/O devices, such as main I/O components 855. In one embodiment, the workload varies in a sinusoidal manner. for example by being pulse width modulated to have a sinusoidal profile.

Once the processor has thus completed executing a workload that varies from minimum to maximum over the period of time on a computing device during the dwell time interval, processing at process block 910 completes, and processing continues to process block 915.

At process block 915, the processor records telemetry data from the computing device during execution of the workload. In one embodiment, temperature sensors 870 generate temperature telemetry signals during execution of the workload, throughout the dwell time interval. The analog transduced signals generated by temperature sensors 870 are transformed into digital telemetry data describing the sensed temperatures by digital to analog converter(s) 875. ADC 875 transmits this temperature telemetry data over $I^2C$ bus 890 to service processor module 805. In one embodiment, P-state systems 865 (and other power management systems of other main components, if any) generate digital telemetry data reporting the current power management state (P-state) of the main processors 845 (and other main components 850, 855), and transmit this P-state telemetry over $I^2C$ bus 890 to service processor module 805. In one embodiment, fan controller(s) 880 generate digital telemetry data reporting the current operating speeds of fans 885 managed by fan controller(s) 880. Fan controller(s) 880 transmit this fan speed telemetry data over $I^2C$ bus 890 to service processor module 805.

In one embodiment, service processor 810 monitors the output of $I^2C$ bus 890 for incoming temperature, P-state, and fan speed telemetry data, and records received telemetry data in telemetry archive 835. For example, the incoming telemetry data may be digitized and written into a real-time circular file as one or more time series data structures (such as a time series signal). In one embodiment, service processor 810 sample the incoming telemetry data at a sampling rate. In one embodiment, temperature telemetry is sampled by ADC(s) 875, fan speed telemetry is sampled by fan controller(s) 880, and P-state is sampled by P-state system 865. In one embodiment, recorded telemetry data includes a time series of processor load, temperature, fan speed, and processor P-state sampled at a time interval—the sampling rate—over a set of dwell time intervals.

Once the processor has thus completed recording telemetry data from the computing device during execution of the workload, processing at process block 915 completes, and processing continues to process block 920.

At process block 920, the processor reduces or otherwise increments the period towards a base period. In one embodiment, the base period is a minimum, shortest period. In one embodiment, the base period is twice a sampling rate of telemetry for the enterprise server 800 (computing device). In one embodiment, the initial period of the workload is a period of one hour or more. In one embodiment, the increment towards the base period is a reduction of the period by a pre-set amount. In one embodiment, the pre-set amount may be a pre-set percentage, and the processor reduces the period by that percentage when the loop iterates (for each dwell time interval). For example, the period may be reduced by 10 percent at each iteration of the loop. In one embodiment, the pre-set amount may be an interval of time, for example, a few seconds or minutes, and the processor reduces the period by that interval when the loop iterates at the end of a dwell time interval. In one embodiment, at the end of a dwell time interval, the processor subtracts the pre-set amount from the period, and sets the period to be the resulting difference. In other words, the processor sets the period to be equal to the period less the pre-set amount. The processor stores this updated period for the next iteration of the loop (the next dwell time interval). Each reduction of the period therefore increments the period towards the base period.

Once the processor has thus completed incrementing the period towards a base period, processing at process block 920 completes, and processing continues to decision block 925.

At decision block 925, the processor determines whether either (i) the base period is reached or (ii) a thermal inertia threshold is reached.

In one embodiment, where the base period is twice the sampling rate of telemetry, the processor retrieves a record of the sampling rate of telemetry, and doubles it to determine the base period. The processor then compares the value of the base period to the value of the current period of the workload. If the value of the base period is greater than or equal to the value of the current period of the workflow (or if the value of the current period is less than or equal to the value of the base period), then the processor determines that the base period is reached, and processing at decision block 925 completes. If the value of the base period is less than the value of the current period (or the value of the current period is greater than the value of the base period), then the processor proceeds to evaluate whether the thermal inertial threshold has been reached.

When temperature variation over a workload period or over a dwell time interval grows small despite the sinusoidal workload variance from minimum to maximum, a thermal inertia limit is being approached. At the thermal inertia limit, the temperature will not measurably change in response to the sinusoidal workload. A thermal inertia threshold level of temperature variation is set, beyond which the temperature change is insufficiently responsive to the workload variance due to thermal inertia. In one embodiment, a thermal inertia threshold is retrieved from memory. In one embodiment, the thermal inertia threshold is that the observed change in temperature from between minimum and maximum temperature over a dwell time interval is less than three degrees Celsius over the dwell time interval. In one embodiment, the processor retrieves a time series of temperature telemetry over the dwell time interval. The processor analyzes the time series of temperature telemetry to determine the minimum and maximum temperature values within the dwell time interval. The processor calculates an observed change in temperature for the dwell time interval by finding the difference between the maximum and minimum temperature values. The processor compares the resulting difference— the observed change—to the value of the thermal inertial threshold. Where the resulting difference is less than or equal to the thermal inertia threshold, the processor determines that the thermal inertia threshold has been reached. Processing at decision block 925 completes.

In one embodiment, the steps of the loop of process blocks 910, 915, 920, and decision block 925 are performed by exerciser logic 895. Where the processor has determined that neither the base period has been reached nor the thermal inertia threshold has been reached (Block 925: NO), processing at decision block 925 completes, and processing returns to process block 910 to repeat the loop for another dwell time interval evaluating a workload with a different (shorter) period. Where the processor has determined that either the base period has been reached or the thermal inertia threshold has been reached (Block 925: YES), processing at decision block 925 completes, and processing continues to process block 930.

At process block 930, the processor analyzes the recorded telemetry data over the set of dwell time intervals to either (i) detect presence of a feedback control instability in thermal control for the computing device; or (ii) confirm feedback control stability in thermal control for the computing device When there exists any instability in the feedback-control algorithms implemented in an enterprise server due to any of the mechanisms enumerated above (quantization of sensor signals, time lags between physical transducers and control firmware, time varying flow impedance in parallel cooling zones, competition among local controllers in servers, or non-synchronicity of telemetry metrics), analysis of the recorded telemetry data will identify the instability, and characterize the situation that causes the instability. An instability is detectable with high clarity in the captured telemetry time series signatures from the server under test because once instability is triggered, then fan speeds and/or power management states (P-states) will spontaneously oscillate throughout their full, minimum-to-maximum range. The oscillation is particularly evident following a transformation of the recorded telemetry data from time domain to frequency domain.

In one embodiment, the processor performs Fourier transform, such as a moving-window fast Fourier transform (FFT), of the workload variable (the value along the sinusoid of the workload curve) and the temperature response variables (that is, the temperature telemetry values measured by temperature sensors 870) to identify any instabilities. Because the workload is a sinusoidal driving function, the power spectral density (PSD) for the driving function shows a single prominent narrow peak in the frequency domain. Similarly, a PSD for any of the digitized thermal telemetry time series will exhibit a peak at the same frequency as the peak for the driving function of the workload. Note that the peak in the temperature response variable is shorter and broadened by thermal inertia, but is still centered at the same frequency as the PSD for the driving function. If control instabilities are triggered at any point during the course of application of workloads over the dwell time intervals, then one or more new peaks appear in the PSD of the temperature response variables. The presence of a feedback control instability in thermal control for the enterprise server computing device is thus detected. This detected instability may be characterized by recording the frequencies of the additional peaks in the PSD for the temperature, the frequency or period of the workload, workload value at the initiation of the instability, and temperature and P-state telemetry values at the initiation of the instability, for example by the processor writing this data to an instability alert file or transmitting an alert message including this information. Conversely, if no instability oscillations are triggered anywhere in the enterprise server during the course of application of workloads over the dwell time intervals, no peaks other than the peak for the frequency of the workload driving functions in each dwell time interval appear in the PSD of the temperature response variables.

In one embodiment, the processor performs a Fourier transform of the workload variable and the power management variable (P-state) from the time domain to the frequency domain. Again, because the workload is sinusoidal, the PSD for the workload shows a single prominent narrow peak in the frequency domain, and the PSD for the P-state shows a peak centered at the same frequency as the workload. If control instability occurs during application of any workload frequency over the set of dwell times, one or more additional peaks will appear in the PSD for the P-state. The presence of a feedback control instability in thermal control for the enterprise server computing device is thus detected by the appearance of the additional peak. This detected instability may be characterized by recording the frequencies of the additional peaks in the PSD for the P-state, the frequency or period of the workload, workload value at the initiation of the instability, and temperature and P-state telemetry values at the initiation of the instability, for example by the processor writing this data to an instability alert file or transmitting an alert message including this information. If no instability oscillations are triggered in the P-state of processors of the enterprise server during the course of application of workloads over the dwell time intervals, no peaks other than the peak for the frequency of the workload driving functions in each dwell time interval appear in the PSD of the p-state variables.

Feedback control stability in thermal control for the computing device is thus confirmed, and one can have a very high confidence that the server system will behave stably when deployed, for example in a data center.

In one embodiment, to detect the presence of or confirm the absence of feedback control instability in thermal control for the enterprise server computing device, the processor (such as service processor 810 or processor 1110) performs a series of steps for each dwell time interval of the set, thereby evaluating each workload period in turn. The processor performs a Fourier transform to convert telemetry data for the dwell time interval from time domain to frequency domain representation. For example, the processor may perform an FFT or a discrete Fourier transform (DFT) with a windowing function, such a moving-window FFT to generate a PSD for the telemetry data. In one embodiment, the telemetry data is temperature data from a single temperature sensor 870. In one embodiment, the telemetry data is an average temperature across multiple temperature sensors 870. In one embodiment, the processor performs the FFT for multiple telemetry data sources, such as multiple temperature sensors 870 and/or P-state systems 865. The processor identifies the amplitude peaks in the frequency domain representation. In one embodiment, the processor identifies the peaks by finding local maxima in the PSD for the telemetry data, for example by searching the searching the PSD for those telemetry values greater than both neighboring (adjacent) values. The processor determines whether there exists an additional amplitude peak in the frequency domain representation other than the amplitude peak corresponding to the period of time (that is, the amplitude peak for the frequency of the workload). The presence of feedback control instability is detected where the additional amplitude peak exists in the frequency domain, and feedback control stability is confirmed where the additional peak does not exist.

In one embodiment, in response to detection of the presence of the feedback control instability, the processor (such as processor 810) composes an alert message that describes the feedback control instability; and either (i) transmits the alert message for display or (ii) transmits the alert message to cause the computing device to be automatically taken out of service. In one embodiment, where the processor transmits the alert message for display, the processor composes the message in a human-readable format, for example as an email message, and the processor transmits the alert message to a remote computing device associated with an administrator or other user of the enterprise server. In one embodiment, where the processor transmits the alert message to cause the computing device to be automatically taken out of service, the processor composes the alert message in a computer-readable format, and transmits it to a management server configured to manage the enterprise server as part of a group, for example as part of a cluster or other group in a datacenter. In response to receiving and parsing the alert message, management server ceases allocating tasks to the enterprise server, and may further alert an administrator, technician, or other user of the need for service. In one embodiment, service I/O components 825 include a service network interface device connected to a management network that is also connected to management server.

In one embodiment, the steps and features of process block 930 are performed by detector logic 897. Once the processor has thus completed analyzing the recorded telemetry data over the set of dwell time intervals to either (i) detect presence of a feedback control instability in thermal control for the computing device; or (ii) confirm feedback control stability in thermal control for the computing device, processing at process block 930 completes, and processing proceeds to end block 935 where method 900 terminates.

In one embodiment, a method associated with detection of feedback control instability in computing device thermal control starts with an extremely slow period for the workload to cycle sinusoidally between minimum and maximum. For example, the initial period may be a 1-hour period. The method then systematically reduces the period of the sinusoidal workload oscillations, increasing the frequency of sinusoidal workload changes, and thereby increasing the frequency of power dissipation and internal component thermal changes. The period of load oscillations is incremented towards a minimum or base period for the server platform under test. The minimum or base workload oscillation frequency may be determined empirically because it depends upon the "thermal inertia" of the server as well as the sampling capabilities for the I$^2$C bus and the ILOM/IPMI firmware (or other management logic 830). Even if the sampling rate for the ILOM/IPMI firmware could be increased without constraint, the increasing frequency of load oscillations will, at some point, cause the thermal inertia of the internal components of the server to dominate such that the sensed temperature simply no longer changes, as discussed above. At this point the internal temperatures would equilibrate to a flat line. As a practical matter, the sinusoidal load oscillations more often will first reach a high enough frequency such that the workload is oscillating faster than the achievable sampling rate of the ILOM/IPMI firmware. When either (or both) of these limiting conditions are reached, the method stops any further reductions in sinusoidal load-cycling period, and evaluates the data recorded over the course of the test. The gradually increasing frequency (or decreasing period) of the workload oscillation over the range of workload stimulates telemetry responses across a full range of server operation conditions. This enables comprehensive parametric characterization of the server for control instability identification for all possible permutations of dynamic frequency stimulation/response. This thereby assures stability for any enterprise server configurations in data centers that have passed the method without detection of instability, regardless of the server's internal fan-speed control algorithms, DVFS P-State control algorithms in the CPUs, and variable fan-speed controllers in the Power Supply Units (PSUs).

Figure 10:
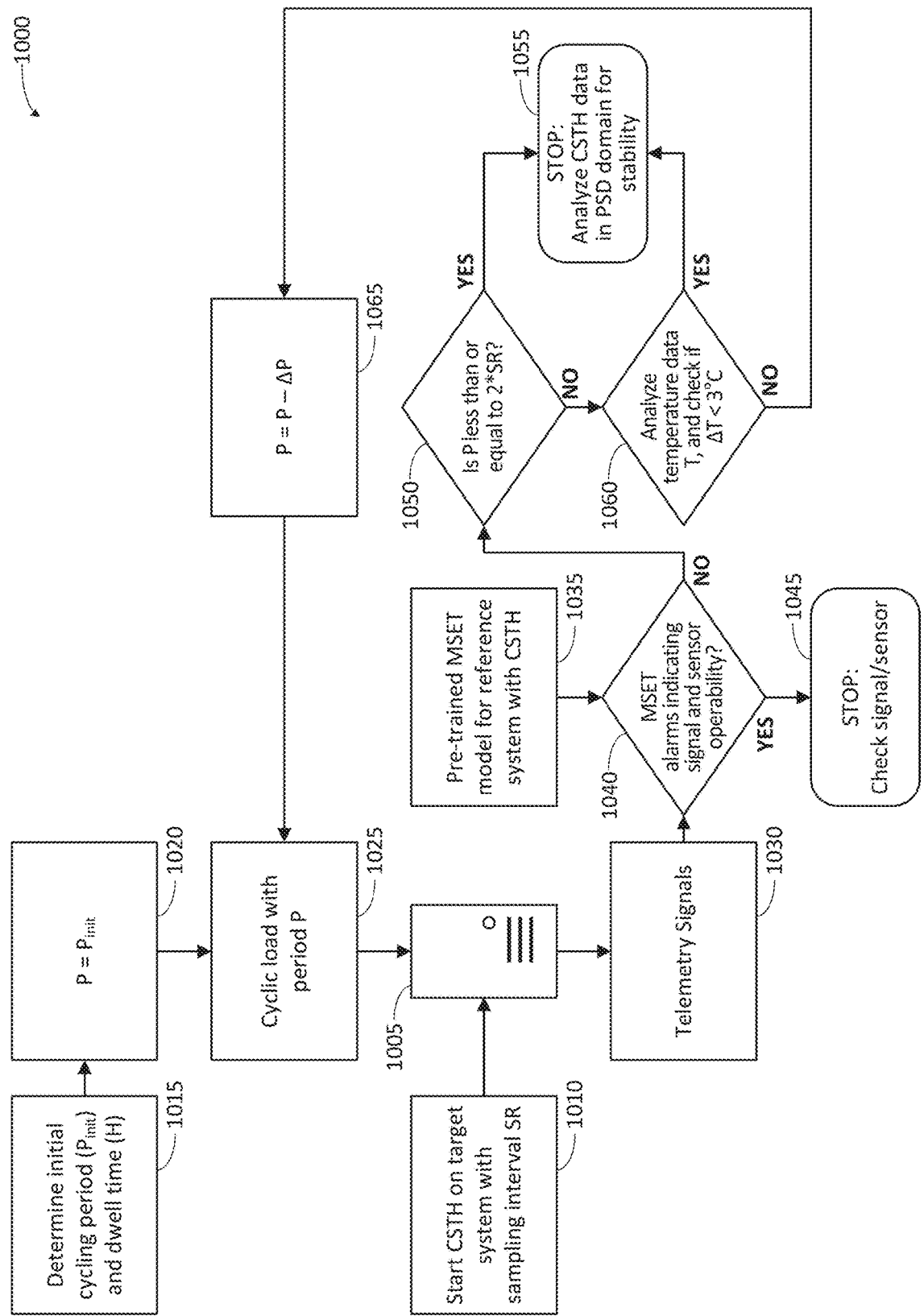
FIG. 10 illustrates one embodiment of a method associated with detection of feedback control instability in computing device thermal control.

FIG. 10 illustrates one embodiment of a method 1000 associated with detection of feedback control instability in computing device thermal control. Method 1000 is executed by a target system 1005 such as enterprise server 800 or computing device 1105 configured with thermal sensing and control systems and logic for detection of feedback control instability in thermal control. Method 1000 may be initiated automatically based on various triggers, such as in response to receiving a signal over a network or parsing stored data indicating that (i) a user (or administrator) of enterprise server 800 has initiated method 1000, (ii) that method 900 is scheduled to be initiated at defined times or time intervals, (iii) that hardware configuration of enterprise server 800 has changed, (iv) that firmware (including thermal control firmware) has changed, or (v) feedback-control instabilities have been observed in thermal control for enterprise server 800.

Initial setup steps occur at the commencement of method 1000. At process block 1010, a continuous system telemetry harness (CSTH) program is launched by the processor. The CSTH may be included in management logic 830, and is configured to sample telemetry data at a sampling interval (SR) to obtain time series of values of the telemetry data at the samplings (observations), and store the sampled values in telemetry archive 835, for example as a time series data structure. At process block 1015, the processor determines (i) an initial period ($P_{init}$) for the workload cycle and (ii) a dwell time interval (H) during which the processor will cause a workload of a particular period to be executed. Sampling interval (SR), initial period ($P_{init}$), and dwell time interval (H) may each be retrieved from memory or storage, and may be included in an exerciser script for executing method 1000. At process block 1020, the processor sets the current period (P) for the workload on target system 1005 to be the initial period ($P_{init}$).

Method 1000 then enters an exerciser loop to generate telemetry data over dwell time interval (H) for a set of incrementally reducing workload periods. At process block 1025, the processor generates or retrieves a cyclic workload with the current period P, and causes it to be executed by main components of target system 1005. At process block 1030, telemetry signals received from target system during execution of the cyclic load over the dwell time interval are sampled and recorded by CSTH in telemetry archive 835.

In one embodiment, a machine learning (ML) model 1035 pre-trained on CSTH telemetry for a reference system of a same type as target system 1005 is retrieved from memory and used to monitor the telemetry signals received from target system 1005. Reference system is a "golden system" certified to be generating telemetry signals representing correct, appropriate, or expected operation of the reference system. ML model 1035 is trained in a supervised learning process on telemetry values generated by the reference system. In one embodiment, the ML model 1035 may be implemented as one or more non-linear non-parametric (NLNP) regression algorithms used for multivariate anomaly detection, including neural networks (NNs), Support Vector Machines (SVMs), autoassociative kernel regression (AAKR), and similarity-based modeling (SBM), such as the multivariate state estimation technique (MSET) (including Oracle's proprietary Multivariate State Estimation Technique (MSET2)). Thus, in one embodiment, the ML model 1035 is a NLNP model or an MSET model. To monitor the telemetry signals from target system 1005, the processor executes the trained ML model 1035 to estimate values of the telemetry signals. The processor calculates the residuals (the absolute value of the difference) between observed values for the telemetry signals and model-estimated values for the telemetry signals. The processor executes a fault detection model to detect anomalous behavior in the telemetry signals. In one embodiment, the fault detection model uses the sequential probability ratio test (SPRT) to detect anomalous deviations from normal operation (or faults) by calculating a cumulative sum of the log-likelihood ratio for each successive residual between the measured signals and estimated values, and comparing the cumulative sum against a threshold at which to determine that a fault is detected. Where the threshold is crossed, an alarm implicating signal or sensor degradation or failure is detected in one or more of the telemetry signals of the target system 1005, and an alarm is issued. At decision block 1040, the processor determines whether such an alarm indicating sensor or signal operability problems has been triggered by the ML monitoring. If so, (block 1040: YES), processing proceeds to end state 1045. At end state 1045, method 1000 stops, and (i) automatically commences a diagnostic routine to check whether telemetry signaling and sensors are operating correctly and or (ii) alerts an administrator or technician administering the test to check whether telemetry signaling and sensors are operating correctly. At decision block 1040, if the processor determines that no alarm indicating sensor or signal operability problems has been triggered by the ML monitoring (block 1040: NO), processing proceeds to decision block 1050. Thus, in one embodiment, the processor retrieves a machine learning model pre-trained on telemetry taken from a reference computing device having a same configuration of the computing device to estimate correct values for the telemetry. The processor executes the machine learning model on the telemetry data recorded from the computing device during execution of the workload. The processor issues an alarm indicating sensor operability problems in response to residuals between the telemetry data and estimated values for the telemetry data exceeding a threshold.

At decision block 1050, the processor checks for the first of two base cases for terminating the exerciser loop: whether the period (P) is less than or equal to twice the sampling rate (2*SR). This indicates that the period has become too small to deliver meaningful information at the given sampling rate. If the period is less than or equal to twice the sampling rate ($P \leq 2*SR$: YES), processing at decision block 1050 ends and processing continues to end state 1055. At end state 1055, fan speed signals and P-State power signals are analyzed in the frequency domain for excess PSD peaks spikes that indicate thermal control instability, for example as described with reference to process block 930 of method 900. If the period is greater than twice the sampling rate ($P \leq 2*SR$: NO), processing at decision block 1050 ends and processing continues to decision block 1060.

At decision block 1060, the processor checks the second of two base cases for terminating the exerciser loop: whether the change in temperature is less than 3 degrees Celsius. When the temperature variation becomes smaller than 3 degree Celsius, this indicates that the thermal inertia limit is reached, at least in a practical sense. As discussed above, 3 degrees Celsius has been found to be a suitable thermal inertia threshold. The temperature telemetry data (T) is analyzed to find the difference (Δ) between the recorded temperature maximum and minimum for the current dwell time interval, and checked to see if it is less than 3 degrees Celsius. If the difference in temperature (T) is less than 3 degrees Celsius, (ΔT<3° C.: YES), then processing at decision block 1060 completes, and processing continues to end state 1055. If the difference in temperature (T) is greater than or equal to 3 degrees Celsius, (ΔT<3° C.: NO), then processing at decision block 1060 completes, and processing continues to process block 1065.

At process block 1065, the current period P is decremented by a pre-determined amount ΔP to give a shorter value for the period of the waveform for the next iteration of the exerciser loop. Processing at process block 1065 then completes and processing continues at process block 1025.

Thus, in one embodiment, an MSET model 1035 is pre-trained with CSTH telemetry on a reference system that is certified to be the golden standard of the target system 1005. Then on the target system 1005, the cyclic load is initialized with a period $P_{init}$ and dwell time (that is, time spent executing a cyclic load of a particular period) H, and simultaneously the CSTH is started with a predefined sampling interval SR. The output telemetry signals are compared to signals estimated by the pre-trained MSET model 1035, and if any MSET alarm is received indicating signal and sensor operability issues, operation of the method is stopped and operability of signals and sensors is checked. Otherwise, where no MSET alarm is received, the period of the cyclic load is iteratively lowered while the period and temperature are checked to see if they have reached base situations. If the period gets to the point where it is lower than 2 times SR, or when the temperature variation becomes smaller than 3 degree C., then the iteration is stopped and the fan speed signals and P-State power signals are analyzed with the FFT PSD for the response variables (telemetry signals). When the system is stable, the PSDs between the signals match, which means the big PSD peak associated with the period of the deterministic cyclic load has the same center as PSD peaks of the response variables. But when an instability is triggered, there is a new and different PSD peak in the response variables, with which a thermal control system of the target system 1005 goes unstable and starts oscillating.

—Environment Testing—

As discussed above, thermal dynamics (the range of change in temperatures) for enterprise servers can vary significantly with the altitude of the datacenter: at higher altitudes the air is thinner and has lower cooling capability for a given cubic-feet-per-minute provisioning rate. Thermal dynamics for enterprise servers can also vary with ambient cooling-air temperature. Accordingly, the methods associated with detection of feedback control instability in computing device thermal control described herein can be repeated for multiple environmental conditions. For example, this may be performed at design time when prototypes of an enterprise server platform can be placed into a thermal/altitude chamber to systematically step through the full range of allowable altitudes and ambient temperatures. In one embodiment, the methods are applied while the server is in a chamber with environmental conditions ranging from sea level to 10,000 ft altitude and from zero to 40 degrees C. for ambient temperature. This environmental (thermal and altitude) testing extension of the methods associated with detection of feedback control instability in computing device thermal control described herein will provide maximal stability assurance for any new server platform at the prototype stage. Accordingly, in one embodiment, the steps of a method associated with detection of feedback control instability in computing device thermal control are repeated by the processor for a sequence of environmental conditions. The processor may initiate each repetition of the method in response to parsing a signal indicating that an ambient temperature and/or pressure around the processor has reached a next environmental condition for evaluation. Confirmation of feedback control stability in thermal control for the computing device at each of the sequence of environmental conditions indicates feedback control stability in thermal control for the computing device across a range of the sequence of environmental conditions.

—Maintenance Testing—

Internal thermal dissipation may change throughout the life of an enterprise server due to changes such as:

(i) CPU "speed bumps," where a processor vendor increases the processor speed for the chips to give the customer more compute power, but with a concomitant increase in power consumption and temperature;

(ii) 3rd-party-component upgrades, for example, I/O card vendors come out with new models that have different airflow dynamics and/or different internal heat dissipation, similarly, HDD models change frequently, and PSU vendors change electrical parameters and/or internal fan parameters, each of which may be swapped into an enterprise server;

(iii) Density and heat-dissipation within a customer rack containing an enterprise server can change periodically as the operator of the enterprise server upgrades other systems and devices in a datacenter; and (iv) Chip-vendor power management firmware upgrades which occur as as power management algorithms are adjusted, improved, or replaced over the life of a CPU or other chip.

Thus, as new heat-dissipating components get installed into empty slots, and as airflow impedance degrades gradually over time (for example due to air filters or narrow heatsink fins accumulating dust, fan motor bearings gradually losing roundness with aging, and/or the environment in which the server is deployed gets increasingly dense with hotter boxes due to the relentless march of Moore's law), it may be beneficial to repeat the methods described herein to detect any newly acquired feedback control instability in the enterprise server's thermal control systems. For at least the above reasons, the systems, methods, and other embodiments associated with detection of feedback control instability in computing device thermal control may be integrated with new enterprise server platforms at design time so that the self-test capability for thermal control stability assurance and instability detection can be exercised as needed any time throughout the life of the enterprise server. Accordingly, in one embodiment, the enterprise server computing system may be integrated with systems, logic, and other components for executing the methods disclosed herein.

—Selected Advantages—

The systems, methods, and other embodiments described herein for detection of feedback control instability in computing device thermal control can detect or confirm the absence of feedback control instability in thermal control regardless of the mechanism that may cause such instability. Thus, if there should exist any lurking instability in the feedback-control algorithms implemented in a server from any one or more of the mechanisms described in detail above-quantization of sensor signals, time lags between physical transducers and control firmware, time-varying flow impedance in parallel cooling zones, competition among local controllers in servers, or non-synchronicity of telemetry metrics-then the systems, methods, and other embodiments described herein will both identify and characterize (that is, describe the features of) that instability. This capability is the starting point for effective mitigation of mechanisms that give rise to oscillations of cooling provisioning and/or power-management states (P-states). Conversely, operating the systems, methods, and other embodiments described herein and detecting no feedback control oscillations anywhere in the server system yields very high confidence that the server system will behave with stable thermal control when deployed to a data center. Therefore, the systems, methods, and other embodiments described herein (i) reduce energy wastage that come from oscillating fan speeds, (ii) reduces vibrations and the resulting increase in HDD seek time, (iii) reduces acoustic noise and the need for noise attenuation, and (iv) improves the long-term reliability for enterprise computing servers. The systems, methods, and other embodiments described herein for detection of feedback control instability in computing device thermal control are capable of confirming thermal control stability under all possible end-customer environment conditions of internal temperatures and rate-of-change of temperatures both for new server platforms being tested as well as throughout the life of the server when configuration and firmware upgrades are implemented.

Mitigation of oscillation in thermal feedback-control loops of an enterprise server enabled by detection and characterization of thermal feedback-control instabilities as described herein results in a number of benefits, including: higher energy efficiency for enterprise servers and higher computational performance. Higher computational performance for compute-intensive workloads is enabled, at least in part, by detection of P-state oscillations from higher to lower states. (Where P-states continuously oscillate from high to low, the average computational frequency approaches 50% of the CPU's design capability. Oscillating P-states substantially reduce overall compute performance, and the systems, methods, and other embodiments described herein enable identification and mitigation of the causes of such oscillations.) The systems, methods, and other embodiments described herein improve vibrational stability, increasing both HDD read/write performance and extending system longevity. The systems, methods, and other embodiments described herein prevent repeated rapid changes in temperature (which accelerate multiple printed circuit board and interconnect degradation mechanisms that are harmful to electronic systems) thereby reducing challenges to long-term system reliability.

Computing Device Embodiment

Figure 11:
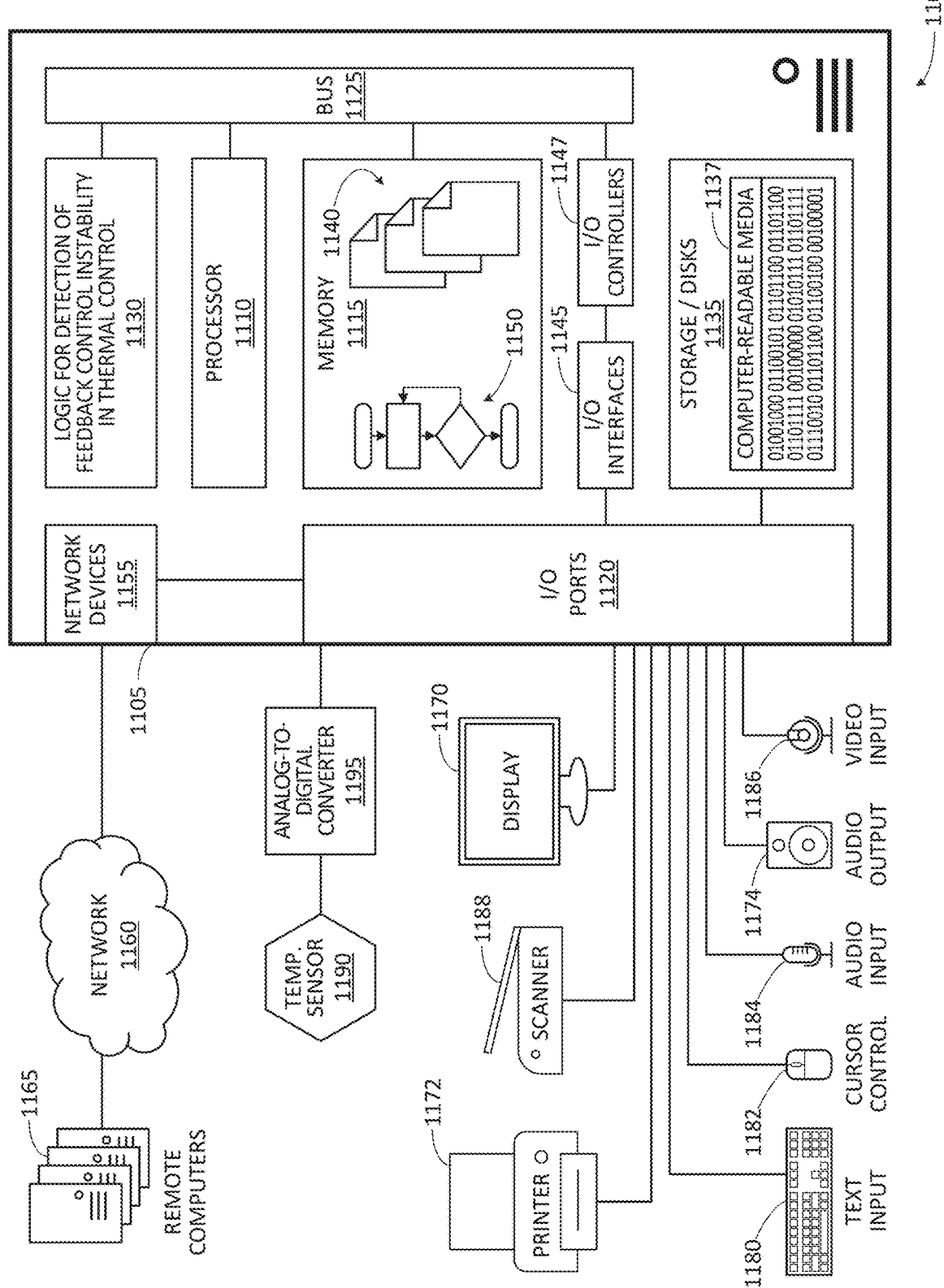
FIG. 11 illustrates an embodiment of a computing system configured with the example systems and/or methods disclosed.

FIG. 11 illustrates an example computing system 1100 that is configured and/or programmed as a special purpose computing device with one or more of the example systems and methods described herein, and/or equivalents. The example computing system may be a computing device 1105 that includes at least one hardware processor 1110, a memory 1115, and input/output ports 1120 operably connected by a bus 1125. In one example, the computer 1105 may include logic for detection of feedback control instability in thermal control 1130 configured to facilitate detection of feedback control instability in thermal control similar to logic/system 840 shown and described with reference to FIGS. 8, 9, and 10.

In different examples, the logic 1130 may be implemented in hardware, a non-transitory computer-readable medium 1137 with stored instructions, firmware, and/or combinations thereof. While the logic 1130 is illustrated as a hardware component attached to the bus 1125, it is to be appreciated that in other embodiments, the logic 1130 could be implemented in the processor 1110, stored in memory 1115, or stored in disk 1135.

In one embodiment, logic 1130 or the computer is a means (e.g., structure: hardware, non-transitory computer-readable medium, firmware) for performing the actions described. In some embodiments, the computing device may be a server operating in a cloud computing system, a server configured in a Software as a Service (SaaS) architecture, a smart phone, laptop, tablet computing device, and so on.

The means may be implemented, for example, as an ASIC programmed to facilitate detection of feedback control instability in thermal control. The means may also be implemented as stored computer executable instructions that are presented to computing device 1105 as data 1140 that are temporarily stored in memory 1115 and then executed by processor 1110.

Logic 1130 may also provide means (e.g., hardware, non-transitory computer-readable medium that stores executable instructions, firmware) for performing detection of feedback control instability in thermal control.

Generally describing an example configuration of the computing device 1105, the processor 1110 may be a variety of various processors including dual microprocessor and other multi-processor architectures. A memory 1115 may include volatile memory and/or non-volatile memory. Non-volatile memory may include, for example, ROM, PROM, and so on. Volatile memory may include, for example, RAM, SRAM, DRAM, and so on.

A storage disk 1135 may be operably connected to the computer 1105 via, for example, an input/output (I/O) interface (e.g., card, device) 1145 and an input/output port 1120 that are controlled by at least an input/output (I/O) controller 1147. The disk 1135 may be, for example, a magnetic disk drive, a solid state disk drive, a floppy disk drive, a tape drive, a Zip drive, a flash memory card, a memory stick, and so on. Furthermore, the disk 1135 may be a CD-ROM drive, a CD-R drive, a CD-RW drive, a DVD ROM, and so on. The memory 1115 can store a process 1150 and/or a data 1140, for example. The disk 1135 and/or the memory 1115 can store an operating system that controls and allocates resources of the computing device 1105.

The computing device 1105 may interact with, control, and/or be controlled by input/output (I/O) devices via the input/output (I/O) controller 1147, the I/O interfaces 1145, and the input/output ports 1120. Input/output devices may include, for example, one or more displays 1170, printers 1172 (such as inkjet, laser, or 3D printers), audio output devices 1174 (such as speakers or headphones), text input devices 1180 (such as keyboards), cursor control devices 1182 for pointing and selection inputs (such as mice, trackballs, touch screens, joysticks, pointing sticks, electronic styluses, electronic pen tablets), audio input devices 1184 (such as microphones or external audio players), video input devices 1186 (such as video and still cameras, or external video players), image scanners 1188, video cards (not shown), disks 1135, network devices 1155, and so on. The input/output ports 1120 may include, for example, serial ports, parallel ports, and USB ports. In one embodiment, the computer 1105 may be connected to temperature sensor 1190 through I/O ports 1120 and analog-to-digital converter ADC 1195 in order to receive sensed temperature information about computing device temperatures. In one embodiment, the computer may be connected to temperature sensor 1190 through ADC 1195 through a service bus, such as an $I^2C$ bus.

The computer 1105 can operate in a network environment and thus may be connected to the network devices 1155 via the I/O interfaces 1145, and/or the I/O ports 1120. Through the network devices 1155, the computer 1105 may interact with a network 1160. Through the network 1160, the computer 1105 may be logically connected to remote computers 1165. Networks 1160 with which the computer 1105 may interact include, but are not limited to, a LAN, a WAN, and other networks.

Software Module Embodiments

In general, software instructions are designed to be executed by one or more suitably programmed processor accessing memory. These software instructions may include, for example, computer-executable code and source code that may be compiled into computer-executable code. These software instructions may also include instructions written in an interpreted programming language, such as a scripting language.

In a complex system, such instructions may be arranged into program modules with each such module performing a specific task, process, function, or operation. The entire set of modules may be controlled or coordinated in their operation by an operating system (OS) or other form of organizational platform.

In one embodiment, one or more of the components described herein are configured as modules stored in a non-transitory computer readable medium. The modules are configured with stored software instructions that when executed by at least a processor accessing memory or storage cause the computing device to perform the corresponding function(s) as described herein.

In one embodiment, modules and other components may intercommunicate by electronic messages or signals. These electronic messages or signals may be configured as calls to functions or procedures that access the features or data of the component or module, such as for example application programming interface (API) calls. Components or modules may (i) generate or compose an electronic message or signal to issue a command or request to another component or module, (ii) transmit the message or signal to other components using the infrastructure (such as busses or networking components of one or more computing devices) and (iii) parse the content of an electronic message or signal received to identify commands or requests that the component or module can perform, and in response to identifying the command, the component or module can automatically perform the command or request.

Definitions and Other Embodiments

In another embodiment, the described methods and/or their equivalents may be implemented with computer executable instructions. Thus, in one embodiment, a non-transitory computer readable/storage medium is configured with stored computer executable instructions of an algorithm/executable application that when executed by a machine(s) cause the machine(s) (and/or associated components) to perform the method. Example machines include but are not limited to a processor, a computer, a server operating in a cloud computing system, a server configured in a Software as a Service (SaaS) architecture, a smart phone, and so on). In one embodiment, a computing device is implemented with one or more executable algorithms that are configured to perform any of the disclosed methods.

In one or more embodiments, the disclosed methods or their equivalents are performed by either: computer hardware configured to perform the method; or computer instructions embodied in a module stored in a non-transitory computer-readable medium where the instructions are configured as an executable algorithm configured to perform the method when executed by at least a processor of a computing device.

While for purposes of simplicity of explanation, the illustrated methodologies in the figures are shown and described as a series of blocks of an algorithm, it is to be appreciated that the methodologies are not limited by the order of the blocks. Some blocks can occur in different orders and/or concurrently with other blocks from that shown and described. Moreover, less than all the illustrated blocks may be used to implement an example methodology. Blocks may be combined or separated into multiple actions/components. Furthermore, additional and/or alternative methodologies can employ additional actions that are not illustrated in blocks. The methods described herein are limited to statutory subject matter under 35 U.S.C § 101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

Acronyms and initialisms used herein have the following meanings:
AAKR: autoassociative kernel regression.
ADC: analog-to-digital converter;
API: application programming interface;
ASIC: application-specific integrated circuit;
BMC: baseboard management controller;
CD: compact disk;
CD-R: CD recordable;
CD-RW: CD rewriteable;
CFM: cubic feet per minute;
CPU: central processing unit;
CSTH: continuous system telemetry harness;
DFT: direct Fourier transform;
DRAM: dynamic RAM;
DVD: digital versatile disk and/or digital video disk;
DVFS: dynamic frequency and voltage scaling;
FFT: fast Fourier transform;
HDD: hard disk drive;
I/O: input/output;
$I^2C$: inter-integrated circuit;
IFC: intelligent fan control;
ILOM: integrated lights out manager;
IPMI: intelligent platform management interface;
LAN: local area network;
ML: machine learning;
MSET: multivariate state estimation technique;
NLNP: non-linear non-parametric;
NN: neural network;
OS: operating system;
PM: power management;

PROM: programmable ROM;
PSD: power spectral density;
PSU: power supply unit;
PWM: pulse width modulation;
RAM: random access memory
ROM: read only memory;
RPM: rotations per minute;
SAAS: software as a service
SBM: similarity-based modeling;
SP: service processor;
SPRT: sequential probability ratio test;
SRAM: synchronous RAM;
SSD: solid-state storage device;
SVM: support vector machine;
USB: universal serial bus; and
WAN: wide area network.

A "data structure", as used herein, is an organization of data in a computing system that is stored in a memory, a storage device, or other computerized system. A data structure may be any one of, for example, a data field, a data file, a data array, a data record, a database, a data table, a graph, a tree, a linked list, and so on. A data structure may be formed from and contain many other data structures (e.g., a database includes many data records). Other examples of data structures are possible as well, in accordance with other embodiments.

"Computer-readable medium" or "computer storage medium", as used herein, refers to a non-transitory medium that stores instructions and/or data configured to perform one or more of the disclosed functions when executed. Data may function as instructions in some embodiments. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, solid state storage device (SSD), flash drive, and other media from which a computer, a processor or other electronic device can function with. Each type of media, if selected for implementation in one embodiment, may include stored instructions of an algorithm configured to perform one or more of the disclosed and/or claimed functions. Computer-readable media described herein are limited to statutory subject matter under 35 U.S.C § 101.

"Logic", as used herein, represents a component that is implemented with computer or electrical hardware, a non-transitory medium with stored instructions of an executable application or program module, and/or combinations of these to perform any of the functions or actions as disclosed herein, and/or to cause a function or action from another logic, method, and/or system to be performed as disclosed herein. Equivalent logic may include firmware, a microprocessor programmed with an algorithm, a discrete logic (e.g., ASIC), at least one circuit, an analog circuit, a digital circuit, a programmed logic device, a memory device containing instructions of an algorithm, and so on, any of which may be configured to perform one or more of the disclosed functions. In one embodiment, logic may include one or more gates, combinations of gates, or other circuit components configured to perform one or more of the disclosed functions. Where multiple logics are described, it may be possible to incorporate the multiple logics into one logic. Similarly, where a single logic is described, it may be possible to distribute that single logic between multiple logics. In one embodiment, one or more of these logics are corresponding structure associated with performing the disclosed and/or claimed functions. Choice of which type of logic to implement may be based on desired system conditions or specifications. For example, if greater speed is a consideration, then hardware would be selected to implement functions. If a lower cost is a consideration, then stored instructions/executable application would be selected to implement the functions. Logic is limited to statutory subject matter under 35 U.S.C. § 101.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). Logical and/or physical communication channels can be used to create an operable connection.

"User", as used herein, includes but is not limited to one or more persons, computers or other devices, or combinations of these.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. § 101.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use.

What is claimed is:

1. One or more non-transitory computer-readable media that include stored thereon computer-executable instructions that when executed by at least a service processor of a computing system cause the computing system to:
  execute a workload on the computing system, wherein the workload varies between a minimum and a maximum at a workload frequency;
  record a thermal telemetry from the computing system during execution of the workload;
  convert the recorded thermal telemetry into a frequency domain;
  detect whether a thermal control of the computing system exhibits feedback control instability based on dissimilarity in the frequency domain between the converted recorded thermal telemetry and the workload frequency; and generate an electronic alert that indicates whether the thermal control of the computing system exhibits the feedback control instability.

2. The non-transitory computer-readable media of claim 1, wherein the instructions to execute the workload further cause the computing system to iteratively, until a threshold for the workload frequency is reached:
maintain the workload frequency of the workload at a frequency value during a dwell time interval, and
incrementally increase the frequency value following the dwell time interval.

3. The non-transitory computer-readable media of claim 2, wherein the threshold is a level of temperature variation beyond which a temperature of the computing system is insufficiently responsive to a variance of the workload between the minimum and the maximum at the workload frequency due to thermal inertia.

4. The non-transitory computer-readable media of claim 1, wherein the instructions to execute the workload further cause the computing system to switch between a minimum utilization state and a maximum utilization state to effect a sinusoidal pattern of the workload at the workload frequency by pulse width modulation.

5. The non-transitory computer-readable media of claim 1,
wherein the thermal telemetry includes one or more of a temperature sensed in the computing system, a p-state cap on processing power in the computing system, and a fan speed of a fan in the computing system; and
wherein the instructions to detect whether the thermal control of the computing system exhibits feedback control instability further cause the computing system to detect the feedback control instability where there is a power spectral density peak in the one or more of the temperature, the p-state, and the fan speed at a frequency other than the workload frequency.

6. The non-transitory computer-readable media of claim 1, wherein the instructions further cause the computing system to confirm that the thermal telemetry is accurate based on similarity between the thermal telemetry and estimates of correct thermal telemetry generated by a machine learning model.

7. A computing system comprising:
one or more processing units;
a service processor and memory configured to manage operations of the one or more processing units;
a thermal control system configured to communicate thermal telemetry of the computing system to the service processor;
one or more non-transitory computer-readable media operably connected to the service processor that include stored thereon computer-executable instructions that when executed by at least the service processor accessing the memory cause the computing system to:
execute a workload on the computing system, wherein the workload varies between a minimum and a maximum at a workload frequency;
record the thermal telemetry during execution of the workload;
convert the recorded thermal telemetry into a frequency domain;
detect whether a thermal control of the computing system exhibits feedback control instability based on dissimilarity in the frequency domain between the converted recorded thermal telemetry and the workload frequency; and
generate an electronic alert that indicates that the thermal control of the computing system either does or does not exhibit the feedback control instability.

8. The computing system of claim 7 wherein the computer-executable instructions to execute the workload further cause the computing system to iteratively, until a thermal inertia threshold for the workload frequency is reached:
maintain the workload frequency of the workload at a frequency value during a dwell time interval, and
incrementally increase the frequency value following the dwell time interval.

9. The computing system of claim 8, wherein the thermal inertia threshold is that an observed change in a sensed temperature of the computer system is less than three degrees Celsius over the dwell time interval.

10. The computing system of claim 7, wherein the instructions to execute the workload further cause the computing system to switch between a minimum utilization state and a maximum utilization state to effect a sinusoidal pattern of the workload at the workload frequency by pulse width modulation.

11. The computing system of claim 7
wherein the thermal control system includes one or more temperature sensors configured to sense a temperature of the computing system, wherein the sensed temperature is included in the thermal telemetry; and
wherein the computer-executable instructions to detect whether the thermal control of the computing system exhibits the feedback control instability further cause the computing system to determine the feedback control instability to be present or absent based at least in part on the sensed temperature.

12. The computing system of claim 7
wherein the thermal control system includes a power management system configured to select a p-state for one or more components of the computing system, wherein the p-state is included in the thermal telemetry; and
wherein the computer-executable instructions to detect whether the thermal control of the computing system exhibits the feedback control instability further cause the computing system to determine the feedback control instability to be present or absent based at least in part on the p-state.

13. The computing system of claim 7
wherein the thermal control system includes one or more fan controllers configured to select a fan speed of one or more fans of the computing system, wherein the fan speed is included in the thermal telemetry; and
wherein the computer-executable instructions to detect whether the thermal control of the computing system exhibits the feedback control instability further cause the computing system to determine the feedback control instability to be present or absent based at least in part on the fan speed.

14. The computing system of claim 7
wherein the computer-executable instructions to convert the recorded thermal telemetry into a frequency domain further cause the computing system to perform moving-window fast Fourier transforms of the workload frequency and the recorded thermal telemetry; and
wherein the computer-executable instructions to detect whether thermal control of the computing system exhibits feedback control instability further cause the computing system to detect the feedback control instability where there is a power spectral density peak in thermal telemetry at a frequency other than the workload frequency.

15. The computing system of claim 7 wherein the computer-executable instructions further cause the computing system to confirm that the thermal telemetry is accurate based on similarity between the thermal telemetry and estimates of correct thermal telemetry generated by a machine learning model.

16. A computer-implemented method, comprising:
executing a workload on a computing system, wherein the workload varies between a minimum and a maximum at a workload frequency;
recording a thermal telemetry from the computing system during execution of the workload;
converting the recorded thermal telemetry into a frequency domain;
confirming that a thermal control of the computing system does not exhibit feedback control instability based on similarity in the frequency domain between the converted recorded thermal telemetry and the workload frequency; and
generating an electronic alert that indicates the thermal control of the computing system to be free of the feedback control instability.

17. The computer-implemented method of claim 16, further comprising iteratively, until a thermal inertia threshold for the workload frequency is reached:
maintaining the workload frequency of the workload at a frequency value during a dwell time interval, and
incrementally increase the frequency value following the dwell time interval.

18. The computer-implemented method of claim 16, further comprising switching the computing system between a minimum utilization state and a maximum utilization state to effect a sinusoidal pattern of the workload at the workload frequency by pulse width modulation.

19. The computer-implemented method of claim 16, wherein confirming that thermal control of the computing system does not exhibit feedback control instability further comprises:
convert the recorded thermal telemetry into a frequency domain further cause the computing system to perform moving-window fast Fourier transforms of the workload frequency and thermal telemetry; and
determine that there are no power spectral density peaks in the recorded thermal telemetry that do not coincide with power spectral density peaks in the workload frequency.

20. The computer-implemented method of claim 16, wherein the thermal telemetry includes time series of one or more of a temperature sensed in the computing system, a p-state cap on processing power in the computing system, and a fan speed of a fan in the computing system.

* * * * *